US010381090B2

(12) United States Patent
Oh et al.

(10) Patent No.: US 10,381,090 B2
(45) Date of Patent: Aug. 13, 2019

(54) OPERATION METHOD OF NONVOLATILE MEMORY DEVICE AND STORAGE DEVICE

(71) Applicant: Samsung Electronics Co., Ltd., Suwon-si, Gyeonggi-do (KR)

(72) Inventors: Eun Chu Oh, Hwaseong-si (KR); Pilsang Yoon, Hwaseong-si (KR); Jun Jin Kong, Yongin-si (KR); Jisu Kim, Seoul (KR); Hong Rak Son, Anyang-si (KR); Jinbae Bang, Anyang-si (KR); Daeseok Byeon, Seongnam-si (KR); Taehyun Song, Suwon-si (KR); Dongjin Shin, Hwaseong-si (KR); Dongsup Jin, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/003,729

(22) Filed: Jun. 8, 2018

(65) Prior Publication Data

US 2018/0294036 A1 Oct. 11, 2018

Related U.S. Application Data

(63) Continuation-in-part of application No. 15/475,670, filed on Mar. 31, 2017.

(30) Foreign Application Priority Data

Jan. 9, 2018 (KR) ........................ 10-2018-0002919

(51) Int. Cl.
*G11C 16/28* (2006.01)
*G11C 16/04* (2006.01)
(Continued)

(52) U.S. Cl.
CPC .......... *G11C 16/28* (2013.01); *G11C 11/5628* (2013.01); *G11C 11/5642* (2013.01);
(Continued)

(58) Field of Classification Search
CPC . G11C 16/28; G11C 11/5628; G11C 11/5642; G11C 16/04; G11C 16/10;
(Continued)

(56) References Cited

U.S. PATENT DOCUMENTS 7,679,133 B2 3/2010 Son et al.
7,889,563 B2 2/2011 Cho et al.
(Continued)

OTHER PUBLICATIONS

U.S. Office Action dated Jun. 28, 2018 issued in copending U.S. Appl. No. 15/475,670.
(Continued)

*Primary Examiner* — John J Tabone, Jr.
(74) *Attorney, Agent, or Firm* — Harness, Dickey & Pierce, P.L.C.

(57) ABSTRACT

An method of operating a nonvolatile memory device including a plurality of memory cells comprises receiving a read command from an external device, in response to the read command, performing, based on a reference voltage, a first cell counting operation with respect to the plurality of memory cells, adjusting at least one read voltage of first through nth read voltages (where n is a natural number greater than 1) based on a first result of the first cell counting operation, and performing, based on the adjusted at least one read voltage, a read operation corresponding to the read command with respect to the plurality of memory cells.

20 Claims, 34 Drawing Sheets

(51) Int. Cl.
*G11C 16/10* (2006.01)
*G11C 11/56* (2006.01)
*G11C 16/34* (2006.01)
*G11C 16/26* (2006.01)
*G11C 29/50* (2006.01)
*G11C 29/02* (2006.01)

(52) U.S. Cl.
CPC .......... *G11C 16/04* (2013.01); *G11C 16/0466* (2013.01); *G11C 16/0483* (2013.01); *G11C 16/10* (2013.01); *G11C 16/26* (2013.01); *G11C 16/3495* (2013.01); *G11C 29/021* (2013.01); *G11C 29/028* (2013.01); *G11C 29/50004* (2013.01); *G11C 2029/5004* (2013.01); *G11C 2211/5634* (2013.01)

(58) Field of Classification Search
CPC . G11C 16/3495; G11C 29/021; G11C 29/028; G11C 2211/5634; G11C 29/50004; G11C 16/0466; G11C 16/0483; G11C 16/26; G11C 2029/5004
USPC ................. 714/721, 718; 365/185.24, 185.2, 365/185.33, 185.18, 189.09, 189.17, 365/210.1
See application file for complete search history.

(56) References Cited

U.S. PATENT DOCUMENTS 7,903,468 B2 3/2011 Litsyn et al.
8,040,725 B2 * 10/2011 Kang .................. G11C 11/5642 365/185.03
8,107,295 B2 * 1/2012 Lee .......................... G11C 8/08 365/185.18
8,365,030 B1 * 1/2013 Choi ................... G06F 11/1048 714/746
8,369,141 B2 2/2013 Sommer et al.
8,553,466 B2 10/2013 Han et al.
8,559,235 B2 10/2013 Yoon et al.
8,644,099 B2 2/2014 Cometti et al.
8,654,587 B2 2/2014 Yoon et al.
8,665,645 B2 3/2014 Avraham et al.
8,737,129 B2 * 5/2014 Lee .......................... G11C 8/10 365/185.09
8,869,008 B2 10/2014 Baum et al.
8,929,140 B2 1/2015 Nagashima
9,036,417 B2 5/2015 Chen et al.
9,058,878 B2 * 6/2015 Aritome .............. G11C 11/5642
9,136,015 B2 9/2015 Anholt et al.
9,224,493 B2 * 12/2015 Lee .......................... G11C 8/10
9,263,137 B2 * 2/2016 Lee ........................ G11C 16/10
9,412,471 B2 * 8/2016 Kim .................... G06F 11/1068
9,437,306 B2 * 9/2016 Lee ........................ G11C 16/10
9,443,578 B2 * 9/2016 Lee ........................ G11C 16/10
9,508,423 B2 * 11/2016 Kim .................... G11C 11/5621
9,558,816 B2 * 1/2017 Han ....................... G11C 16/26
9,563,503 B2 * 2/2017 Seo ..................... G06F 11/1068
9,564,237 B2 * 2/2017 Lee .......................... G11C 8/10
9,570,184 B2 * 2/2017 Mokhlesi ............ G11C 11/5642
9,595,320 B2 3/2017 Wu et al.
9,645,177 B2 5/2017 Cohen et al.
9,665,425 B2 * 5/2017 Seo ..................... G06F 11/1068
9,691,488 B1 * 6/2017 Griffin ................... G11C 16/26
9,892,796 B2 * 2/2018 Jin ......................... G11C 16/26
2010/0046289 A1 * 2/2010 Baek ................... G11C 11/5628 365/185.2
2010/0124119 A1 * 5/2010 Lee .......................... G11C 8/08 365/185.18
2011/0233648 A1 9/2011 Seol et al.
2012/0120732 A1 * 5/2012 Lee .......................... G11C 8/10 365/185.22
2013/0016562 A1 * 1/2013 Mun ................... G11C 11/5628 365/185.12
2013/0235662 A1 * 9/2013 Fujiu .................. G11C 16/3459 365/185.03
2013/0318422 A1 11/2013 Weathers et al.
2014/0126285 A1 * 5/2014 Kang .................... G11C 16/26 365/185.2
2014/0229131 A1 8/2014 Cohen et al.
2014/0254271 A1 * 9/2014 Lee .......................... G11C 8/10 365/185.11
2014/0293696 A1 * 10/2014 Lin ........................ G11C 16/26 365/185.12
2014/0321204 A1 * 10/2014 Yang ...................... G11C 16/26 365/185.03
2015/0003151 A1 * 1/2015 Lee ........................ G11C 16/10 365/185.02
2015/0085571 A1 3/2015 Hu et al.
2015/0117107 A1 * 4/2015 Sun ........................ G11C 16/10 365/185.12
2015/0261467 A1 * 9/2015 Seo ..................... G06F 11/1068 714/758
2015/0262694 A1 * 9/2015 Seo ..................... G06F 11/1068 714/764
2016/0004437 A1 * 1/2016 Kim ..................... G11C 29/021 714/764
2016/0078955 A1 * 3/2016 Lee .......................... G11C 8/10 365/185.11
2016/0111162 A1 * 4/2016 Lee ........................ G11C 16/10 365/185.03
2016/0141024 A1 * 5/2016 Lee ........................ G11C 16/10 365/185.03
2016/0225439 A1 * 8/2016 Kim .................... G11C 11/5621
2016/0225440 A1 * 8/2016 Han ....................... G11C 16/26
2017/0125111 A1 5/2017 Sankaranarayanan et al.
2017/0200505 A1 * 7/2017 Jin ......................... G11C 16/26
2017/0300252 A1 * 10/2017 Yim ...................... G06F 3/0619
2018/0004417 A1 * 1/2018 Park ........................ G06F 3/061
2018/0075919 A1 * 3/2018 Pang .................. G11C 16/0466
2018/0122483 A1 * 5/2018 Yang ...................... G11C 16/06
2018/0122484 A1 * 5/2018 Jin ......................... G11C 16/26
2018/0286495 A1 10/2018 Oh et al.

OTHER PUBLICATIONS

U.S. Notice of Allowance dated Oct. 18, 2018 issued in co-pending U.S. Appl. No. 15/475,670.

* cited by examiner

FIG. 9

| Read Sequence | | | | | | | | |
|---|---|---|---|---|---|---|---|---|
| Page | LSB | | CSB | | | | MSB | |
| Read Voltage Level | RD2 | RD5 | RD1 | RD3 | | RD6' (RD6+ΔRD6_3) | RD4 | RD7 |
| Sequence | 1 | 2 | 1 | 2 | Cell Count Operation | 3 | 1 | 2 |

FIG. 11

| Read Sequence | | | | | | | | |
|---|---|---|---|---|---|---|---|---|
| Page | LSB | | | CSB | | | MSB | |
| Read Voltage Level | RD2 | | RD5' (RD5+ΔRD5_2) | RD1 | RD3 | RD6' (RD6+ΔRD6_1) | RD4 | RD7 |
| Sequence | 1 | Cell Count Operation | 2 | 1 | 2 | 3 | 1 | 2 |

Cell Count Operation

FIG. 13

| | Read Sequence | | | | | | | | |
|---|---|---|---|---|---|---|---|---|---|
| Page | LSB | | | CSB | | | MSB | | |
| Read Level | RD2 | | RD5 | RD1 | RD3 | RD6 | RD4 | | RD7' (RD7+ΔRD7_4) |
| Sequence | 1 | Cell Count Operation | 2 | 1 | 2 | 3 | 1 | Cell Count Operation | 2 |
| | | | | | Cell Count Operation | | | | |

FIG. 15

| Read Sequence | | | | | | | | | |
|---|---|---|---|---|---|---|---|---|---|
| Page | LSB | | | CSB | | | MSB | | |
| Read Level | RD2 | | RD5' (RD5+ΔRD5_2) | RD1 | RD3 | RD6' (RD6+ΔRD6_1) | RD4 | | RD7' (RD7+ΔRD7_4) |
| Sequence | 1 | Cell Count Operation | 2 | 1 | 2 | 3 | 1 | Cell Count Operation | 2 |

Cell Count Operation

OPERATION METHOD OF NONVOLATILE MEMORY DEVICE AND STORAGE DEVICE

CROSS-REFERENCE TO RELATED APPLICATIONS

This application is a continuation-in-part of U.S. patent application Ser. No. 15/475,670, filed on Mar. 31, 2017 and claims priority under 35 U.S.C. § 119 of Korean Patent Application No. 10-2018-0002919, filed on Jan. 9, 2018, the entire contents of each of which are hereby incorporated by reference.

Inventive concepts relates to semiconductor memories, and more particularly, to an operation method of a nonvolatile memory device.

A semiconductor memory device is implemented using a semiconductor such as silicon Si, germanium Ge, gallium arsenide GaAs, indium phosphide InP, etc. A semiconductor memory device may be classified as a volatile memory device or a nonvolatile memory device.

A volatile memory device loses may loses stored data when a power supply is interrupted. A nonvolatile memory device may retain stored data even when a power supply is interrupted. Examples of the volatile memory device include a SRAM (Static RAM), a DRAM (Dynamic RAM), a SDRAM (Synchronous DRAM), etc. Examples of the nonvolatile memory device are a read only memory (ROM), a programmable ROM (PROM), an electrically programmable ROM (EPROM), an electrically erasable and programmable ROM (EEPROM), a flash memory device, a phase change RAM (PRAM), a magnetic RAM (MRAM), a resistive RAM (RRAM), a ferroelectric RAM (FRAM), etc.

A flash memory may include charge trap flash (CTF) memory cells. The charge trap flash (CTF) memory cell may remember a program state by storing charges in a charge storage layer. Charges stored in the charge storage layer of the charge trap flash (CTF) memory cells are programmed and then flow into a channel. As charges flow into the channel, a distribution of threshold voltages of the charge trap flash (CTF) memory cells may be changed. Because of a physical characteristic of the charge trap flash (CTF) memory cells, reliability of data stored in the memory cells may be degraded.

SUMMARY

A method of operating a nonvolatile memory device according some example embodiments of inventive concepts includes receiving a read command from an external device, in response to the read command, performing, based on a reference voltage, a first cell counting operation with respect to the plurality of memory cells, adjusting at least one read voltage of first through nth read voltages (where n is a natural number greater than 1) based on a first result of the first cell counting operation, and performing, based on the adjusted at least one read voltage, a read operation corresponding to the read command with respect to the plurality of memory cells.

A method of operating a nonvolatile memory device including a plurality of memory cells according to some example embodiments of inventive concepts includes receiving a read command from an external device, in response to the read command, performing a multi-sensing read operation based on at least two reference voltages, adjusting at least one of first through nth read voltages (n is a natural number greater than 1) based on a first result of the multi-sensing read operation, and performing, based on the first through nth read voltages, a read operation corresponding to the read command with respect to the plurality of memory cells.

A storage device according to some example embodiments of inventive concepts comprises a nonvolatile memory device including a plurality of memory cells and reading data stored in the plurality of memory cells based on first through nth read voltages (where n is a natural number greater than 1), and a memory controller configured to transmit parameters including information about a read voltage level change of each of the first through nth read voltages after transmitting a read command and an address to the nonvolatile memory device. The nonvolatile memory device is configured to perform a sensing operation with respect to the plurality of memory cells based on a reference voltage, perform a cell counting operation based on the sensing operation, adjust at least one read voltage of the first through nth read voltages based on a result of the cell counting operation and the parameters, and read data stored in the plurality of memory cells based on the adjusted at least one read voltage.

BRIEF DESCRIPTION OF THE FIGURES

Embodiments of inventive concepts will be described below in more detail with reference to the accompanying drawings. Embodiments of inventive concepts may, however, be implemented in different forms and should not be constructed as limited to the embodiments set forth herein. Rather, these embodiments are provided so that this disclosure will be thorough and complete, and will fully convey the scope of inventive concepts to those skilled in the art. Like numbers refer to like elements throughout.

FIG. 7 is a distribution diagram illustrating an initial program threshold voltage distribution of memory cells and a changed threshold voltage distribution of the memory cells as time goes by.

FIG. 9 is a table describing a characteristic of a cell count comparison operation which is selectively applied according to some example embodiments of inventive concepts.

FIG. 11 is a table describing a characteristic of a cell count comparison operation which is selectively applied according to some example embodiments of inventive concepts.

FIG. 13 is a table describing a characteristic of a cell count comparison operation which is selectively applied according to example embodiments of inventive concepts.

FIG. 15 is a table describing a characteristic of a cell count comparison operation which is selectively applied according to some example embodiments of inventive concepts.

DETAILED DESCRIPTION OF EXAMPLE EMBODIMENTS

Figure 1:
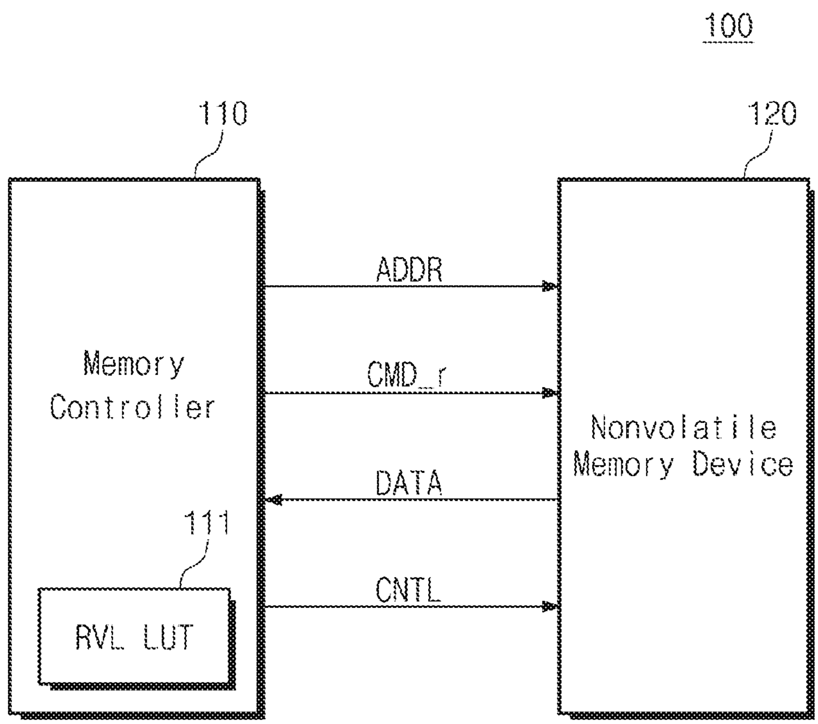
FIG. 1 is a block diagram illustrating a nonvolatile memory storage system according to some example embodiments of inventive concepts.

FIG. 1 is a block diagram illustrating a nonvolatile memory storage system according to some example embodiments of inventive concepts. Referring to FIG. 1, a nonvolatile memory storage system 100 may include a memory controller 110 and a nonvolatile memory device 120.

The memory controller 110 may control the nonvolatile memory device 120 under the control of an external device. For example, the memory controller 110 may transmit an address ADDR, a read command CMD_r, and a control signal CNTL to read data DATA stored in the nonvolatile memory device 120.

The nonvolatile memory device 120 may operate under the control of the memory controller 110. For example, the nonvolatile memory device 120 may receive the address ADDR, a read command CMD_r, and a control signal CNTL from the memory controller 110. The nonvolatile memory device 120 may transmit data DATA corresponding to the received address ADDR to the memory controller 110 in response to the received signals.

The memory controller 110 may include a read voltage level lookup table (RVL LUT) 111. The RVL LUT 111 may include information that maps a relation among read voltage level changes according to a reference cell count. The reference cell count is a value which is set to adjust a read voltage. The RVL LUT 111 will be described with reference to FIGS. 7 and 8.

After a program of the memory cells is completed, a threshold voltage distribution may be changed. Accordingly, when a read operation of the memory cells is performed using a desired (or, alternatively, predetermined) read voltage, an error may occur. To reduce the number of errors and occurrence probability of the error, the nonvolatile memory device 120 may adjust a read voltage level. A specific method of adjusting a level of the read voltage will be described in detail with reference to drawings below.

The memory controller 110 may transmit information of the read voltage level lookup table RVL LUT 111 to the nonvolatile memory device 120 together with the read command CMD_r. For example, the memory controller 110 may transmit information of the RVL LUT 111 to the nonvolatile memory device 120 only once together with the read command CMD_r. In some example embodiments, whenever transmitting the read command CMD_r to the nonvolatile memory device 120, the memory controller 110 may transmit the information of the RVL LUT 111 together. In some example embodiments, in response to a request of the nonvolatile memory device 120, the memory controller 110 may transmit the information of the read voltage level lookup table RVL LUT 111 to the nonvolatile memory device 120 together with the read command CMD_r. In some example embodiments, in response to a request of a user, the memory controller 110 may transmit the information of the RVL LUT 111 to the nonvolatile memory device 120 together with the read command CMD_r.

For example, the read voltage level lookup table RVL LUT 111 may be periodically updated. The read voltage level lookup table RVL LUT 111 may be updated according to a request of a user. When the read voltage level lookup table RVL LUT 111 is updated, the memory controller 110 may transmit the information of the read voltage level lookup table RVL LUT 111 together.

The memory controller 110 may transmit a control signal CNTL to the nonvolatile memory device 120 to adjust a read voltage level of the nonvolatile memory device 120. The nonvolatile memory device 120 may adjust the read voltage level in response to the control signal CNTL.

In response to the read voltage, the nonvolatile memory device 120 may count memory cells that form a current path in a channel Otherwise, the nonvolatile memory device 120 may count memory cells that cut off a current path of a channel in response to the read voltage. A cell count may be a counting result of memory cells that form a current path in a channel or memory cells that cut off a current path of a channel in response to the read voltage. A count of the memory cells that form a current path in a channel in response to the read voltage is an on-cell count and a count of the memory cells that cut off a current path of a channel in response to the read voltage is an off-cell count.

The nonvolatile memory device 120 may receive the information of the RVL LUT 111 from the memory controller 110. The nonvolatile memory device 120 may store the information of the RVL LUT 111 in a ROM and/or in a memory (e.g., a code memory) as a part of a firmware code of the nonvolatile memory device 120. The nonvolatile memory device 120 may adjust the read voltage level using the information of the RVL LUT 111 and the cell count in response to the control signal CNTL.

The nonvolatile memory device 120 may read data DATA through the adjusted read voltage. The nonvolatile memory device 120 may transmit the read data DATA to the memory controller 110. The memory controller 110 may calculate read voltage level changes based on access environment information of when accessing the nonvolatile memory device 120. The environment information will be described with reference to FIG. 2.

Figure 2:
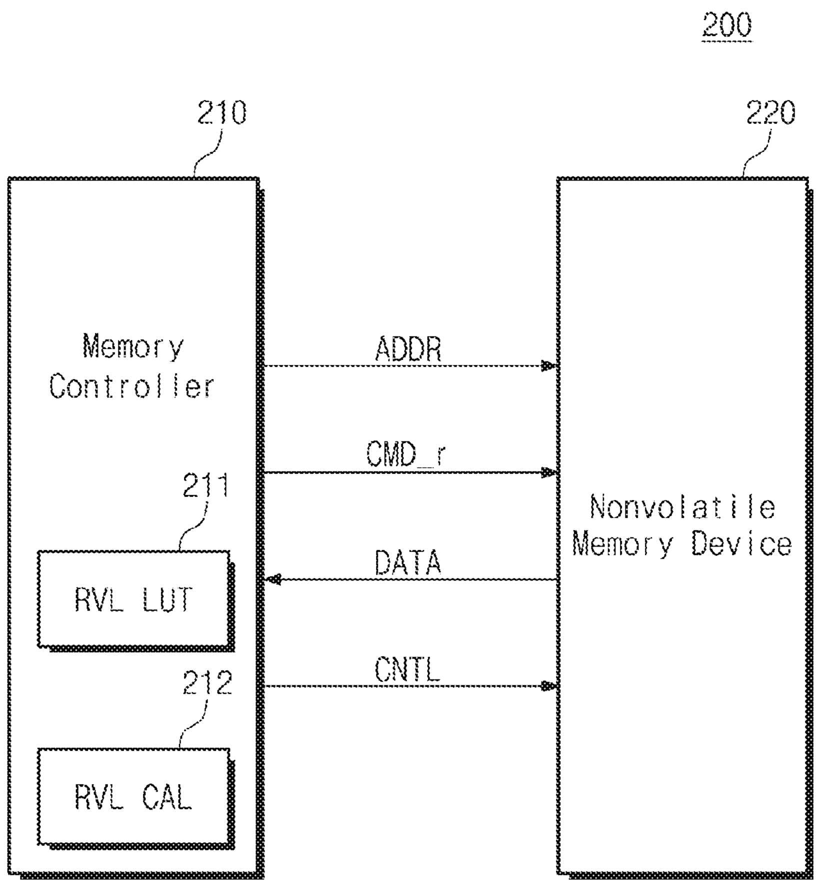
FIG. 2 is a block diagram illustrating a nonvolatile memory storage system according to some example embodiments of inventive concepts.

FIG. 2 is a block diagram illustrating a nonvolatile memory storage system according to some example embodiments of inventive concepts. Referring to FIG. 2, a nonvolatile memory storage system 200 may include a memory controller 210 and a nonvolatile memory device 220. Since the memory controller 210 and the nonvolatile memory device 220 illustrated in FIG. 2 are similar to or the same as the memory controller 110 and the nonvolatile memory device 120 illustrated in FIG. 1, a description thereof is omitted.

The memory controller 210 may include a RVL LUT 211 and a read voltage level calculator RVL CAL 212. The RVL LUT 211 may include information that maps a relation among read voltage level changes according to a reference cell count.

The RVL CAL 212 may include a hardware configuration, a software configuration, or a hybrid configuration thereof. The RVL CAL 212 may include a special-purpose hardware circuit configured to perform a specific operation. The RVL CAL 212 may include at least one processor core that can execute an instruction set of a program code configured to perform the specific operation.

The RVL CAL 212 may calculate read voltage level changes based on access environment information. The access environment information may include at least one of a location of a target block, a location of a target string selection line, a location of a target word line, temperature, program/erase count, and cell count.

The target block information may include an address of a memory block in which a read operation is performed or information about a location of the target block in all memory blocks (e.g., information about whether the target block is located at the center of the memory blocks or outskirts of the memory blocks). The target string selection line information may include an address of a string selection line corresponding to a page in which a read operation is performed or information about a location of the string selection line in the target block.

The target word line information may include information about an address of a word line connected to a page in which a read operation is performed and/or information about a location of a word line in the target block. The temperature information may indicate a temperature of when the controller 210 performs a read operation on the nonvolatile memory device 220.

The program and erase count indicates the number of times that program and erase operations are performed at a target block. An on-cell count may indicate the number of memory cells that forms a current path on a channel in response to a read voltage of the nonvolatile memory device 220. An off-cell count may indicate the number of memory cells that forms a current path on a channel in response to a read voltage of the nonvolatile memory device 220.

The memory controller 210 may transmit at least one of information of the RVL LUT 211 and information about read voltage level changes calculated in the RVL CAL 212 to the nonvolatile memory device 220.

The memory controller 210 illustrated in FIG. 2 includes the RVL LUT 211 and the RVL CAL 212. However, inventive concepts are not limited thereto and the memory controller 210 may include only the RVL CAL 212. When the memory controller 210 calculates read voltage level changes using the RVL CAL 212, the memory controller 210 may directly reflect access environment information of when accessing the nonvolatile memory device 120. Because of this, the memory controller 210 can more accurately calculate read voltage level changes reflected in a read voltage.

Figure 3:
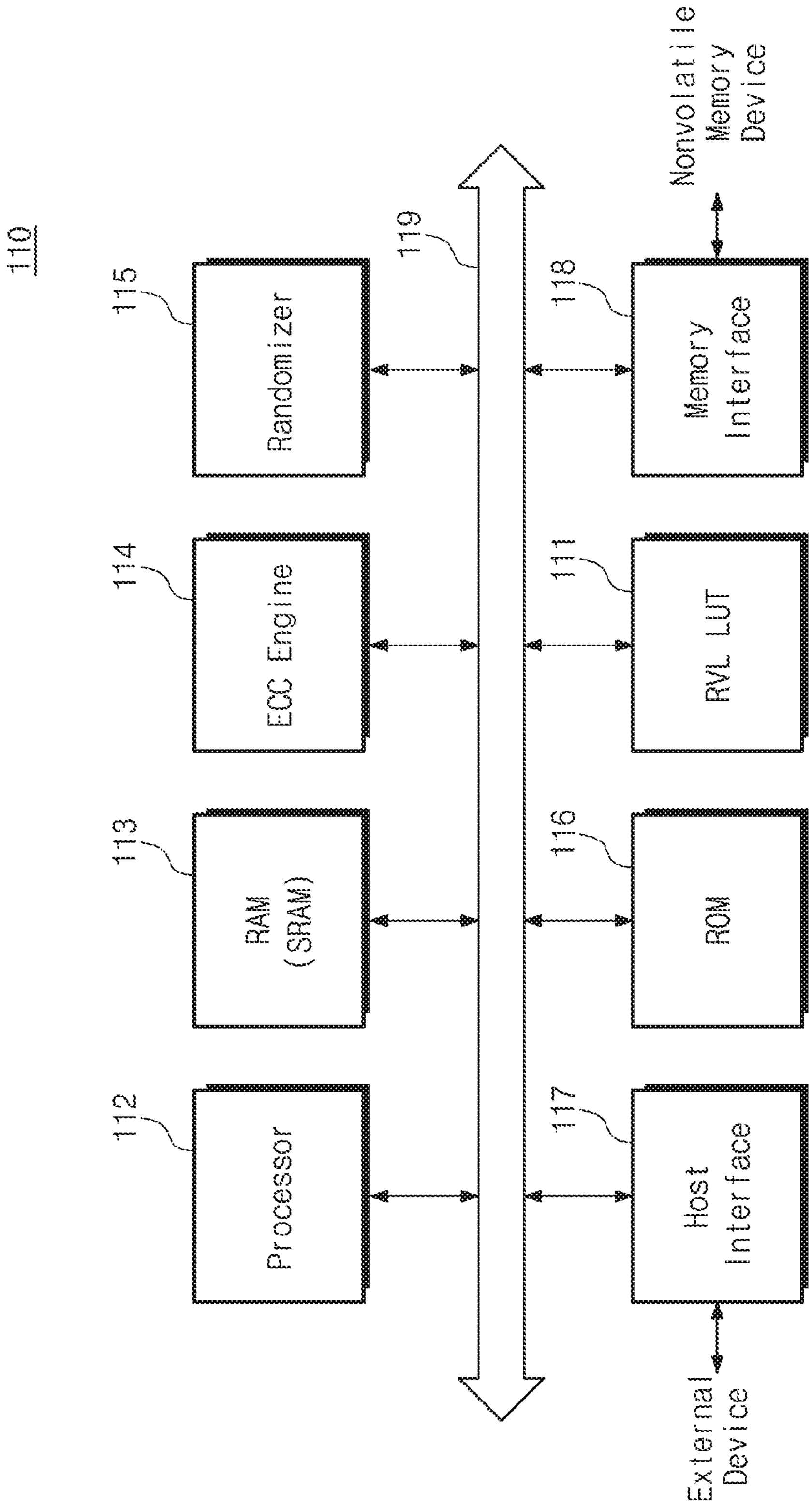
FIG. 3 is a block diagram illustrating a memory controller illustrated in FIG. 1.

FIG. 3 is a block diagram illustrating a memory controller illustrated in FIG. 1. Referring to FIG. 3, the memory controller 110 may include a RVL LUT 111, a processor 112, a RAM 113, an ECC (error correcting code) engine 114, a randomizer 115, a ROM 116, a host interface 117, a memory interface 118, and a bus 119.

The processor 112 may include at least one processor core that can execute an instruction set of a program code configured to perform a specific operation. Each of the ECC engine 114 and the randomizer 115 may include a hardware configuration, a software configuration, or a hybrid configuration thereof to perform operations that will be described later. Each of the ECC engine 114 and the randomizer 115 may include a special-purpose hardware circuit configured to perform a specific operation. Each of the ECC engine 114 and the randomizer 115 may include at least one processor core that can execute an instruction set of a program code configured to perform the specific operation.

The RVL LUT 111 may be managed on a per-memory block basis. The RVL LUT 111 may be desired (or, alternatively, predetermined) or updated according to a program and erase count of the memory block and a characteristic of the memory block. The RVL LUT 111 may be managed on a per-word line basis. The RVL LUT 111 may be desired (or, alternatively, predetermined) or updated according to a location of the word line. The RVL LUT 111 may be managed in units of read voltages. The RVL LUT 111 may be desired (or, alternatively, predetermined) or updated on each of the read voltages.

The RVL LUT 111 may be stored in the RAM 113 and may be updated by the processor 112. The RVL LUT 111 may be stored in the ROM 116 in the form of firmware. The RVL LUT 111 updated by the processor 112 may be flushed, e.g., sent, to the nonvolatile memory device 120.

The processor 112 may control an overall operation of the memory controller 110. The processor 112 may execute a command code of firmware stored in the ROM 116. The RAM 113 may operate as at least one of a buffer memory, a cache memory, an operation memory, and a main memory. The RAM 113 may store the RVL LUT 111. The RAM 113 may be a SRAM.

The ECC engine 114 may generate an error correction code on data to be stored in the nonvolatile memory device 120. The ECC engine 114 may detect an error of data DATA read from the nonvolatile memory device 120, and may correct the detected error based on the error correction code.

The randomizer 115 may randomize data DATA to be stored in the nonvolatile memory device 120. For example, at least some of the memory cells of the nonvolatile memory device 120 may be triple level cells (TLC) each of which stores 3-bit data. In this case, each of the triple level cells (TLC) may be programmed to have one of an erase state and a plurality of program states. The randomizer 115 may randomize data DATA so that program states of memory cells connected to one word line have the same ratio. When randomized data is stored in the memory cells connected to one word line, the number of memory cells having the erase state among the memory cells connected one word line and the number of memory cells having each program state among the memory cells connected one word line may be the same.

The ROM 116 may store various types of information required to operate the memory controller 110. The ROM 116 may store various types of information in the form of firmware.

The memory controller 110 may communicate with an external device (e.g., a host) through the host interface 117. The memory controller 110 may communicate with the nonvolatile memory device 120 through the memory interface 118. The host interface 117 may include various interfaces such as a USB (universal serial bus), a MMC (multimedia card), an eMMC (embedded MMC), a PCI (peripheral component interconnection), a PCI-E (PCI-express), an ATA (advanced technology attachment), a serial-ATA, a parallel-ATA, a SCSI (small computer small interface), an ESDI (enhanced small disk interface), an IDE (integrated drive electronics), a MIPI (mobile industry processor interface), a NVMe (nonvolatile memory-express), and/or other elements.

The bus 119 may connect the RVL LUT 111, the processor 112, the RAM 113, the ECC engine 114, the randomizer 115, the ROM 116, the host interface 117, and the memory interface 118 to one another. The RVL LUT 111, the processor 112, the RAM 113, the ECC engine 114, the randomizer 115, the ROM 116, the host interface 117, and the memory interface 118 may communicate with one another through the bus 119.

As described above, the memory controller 110 may transmit a read command CMD_r and information of the RVL LUT 111 to the nonvolatile memory device 120 together. The nonvolatile memory device 120 may adjust a read voltage level with reference to the read command CMD_r and the information of the RVL LUT 111.

Figure 4:
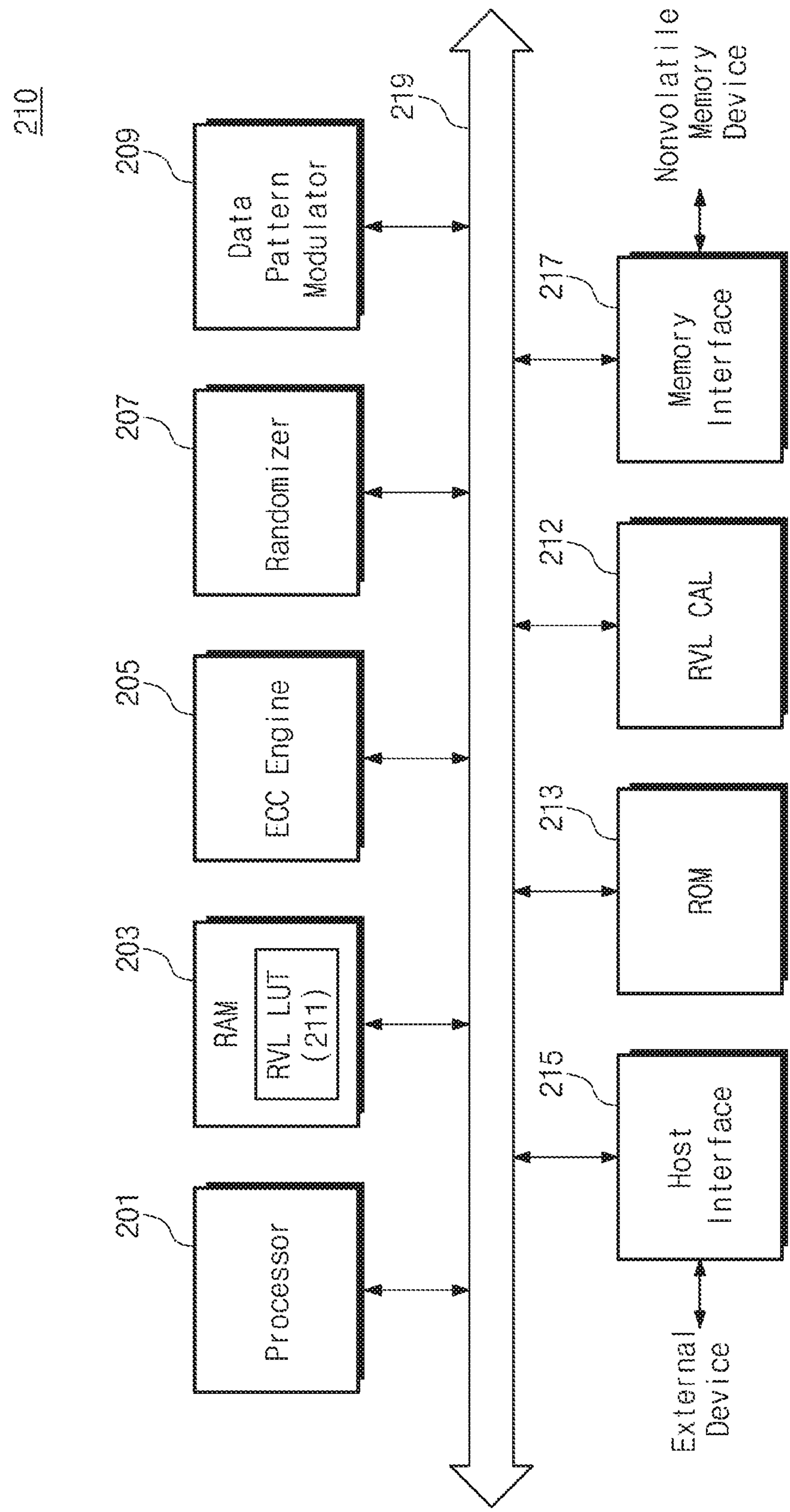
FIG. 4 is a block diagram illustrating a memory controller illustrated in FIG. 2.

FIG. 4 is a block diagram illustrating a memory controller illustrated in FIG. 2. The memory controller 210 may include a processor 201, a RAM 203, an ECC engine 205, a randomizer 207, a data pattern modulator 209, a RVL CAL 212, a ROM 213, a host interface 215, a memory interface 217, and a bus 219.

Since the processor 201, the ECC engine 205, the randomizer 207, the ROM 213, the host interface 215, the memory interface 217, and the bus 219 are similar to or the same as the processor 112, the ECC engine 114, the randomizer 115, the ROM 116, the host interface 117, the memory interface 118, and the bus 119, a description thereof is omitted.

A RVL LUT 211 may be stored in the RAM 203 and may be updated by the processor 201. The RVL LUT 211 may be stored in the ROM 213 in the form of firmware. However, inventive concepts are not limited thereto, the RVL LUT 211 updated by the processor 201 may be flushed to the nonvolatile memory device 220.

The data pattern modulator 209 may include a hardware configuration, a software configuration, or a hybrid configuration thereof to perform operations that will be described later. The data pattern modulator 209 may include a special-purpose hardware circuit configured to perform a specific operation. The data pattern modulator 209 may include at least one processor core that can execute an instruction set of a program code configured to perform the specific operation.

The data pattern modulator 209 may reduce the number of data corresponding to an error-prone program state to prevent, or reduce the likelihood of, deterioration of data stored in memory cells of the nonvolatile memory device 220. When the nonvolatile memory device 220 includes triple level cells (TLC), memory cells included in the nonvolatile memory device 220 may be programmed to one of an erase state and first through seventh program states. At this time, a threshold voltage of the seventh program state may have the highest level. The data pattern modulator 209 may reduce the number of memory cells programmed to the seventh program state by reducing the number of 3-bit data corresponding to the seventh program state.

Figure 5:
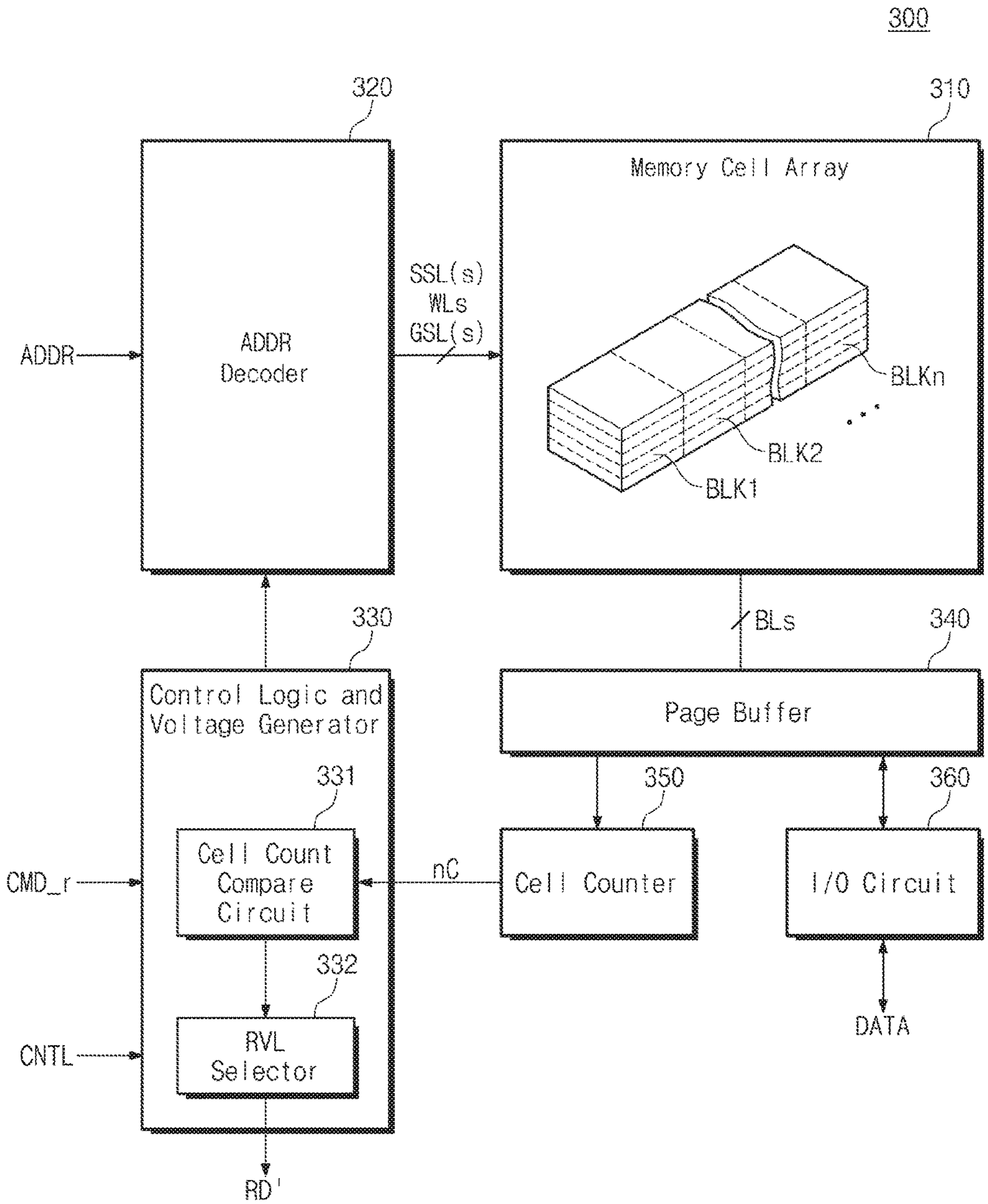
FIG. 5 is a block diagram illustrating a nonvolatile memory device according to some example embodiments of inventive concepts.

FIG. 5 is a block diagram illustrating a nonvolatile memory device according to example embodiments of inventive concepts.

Referring to FIG. 5, a nonvolatile memory device 300 may include a memory cell array 310, an address decoder 320, a control logic and voltage generator 330, a page buffer 340, a cell counter 350, and an input/output circuit 360. The nonvolatile memory device 300 illustrated in FIG. 5 may be similar to or the same as the nonvolatile memory devices 120 and 220 illustrated in FIGS. 1 and 2.

The memory cell array 310 may include a plurality of memory blocks (e.g., BLK1~BLKn, where n is an integer equal to or greater than 2). Each of the memory blocks includes a plurality of strings. Each of the strings is connected to a plurality of bit lines BL. Each of the strings is connected to a plurality of memory cells. The memory cells are connected to a plurality of word lines WL respectively. Each memory cell may be provided as either a triple-level cell (TLC) or a quadruple-level cell (QLC) including bits greater than 2 bits. The memory cell array 310 will be described with reference to FIG. 6.

The address decoder 320 is connected to the memory cell array 310 through a plurality of word lines WLs, at least one string selection line SSL(s), and at least one ground selection line GSL(s). The address decoder 320 may receive an address ADDR from the memory controller 110 or 210. The address decoder 320 is configured to decode the received address ADDR. The address decoder 320 may control a voltage applied to the word lines WLs based on the decoded address ADDR.

The control logic and voltage generator 330 may include a cell count comparison circuit 331 and a read voltage level selector 332. The control logic and voltage generator 330 may control the address decoder 320 and the input/output circuit 360. The control logic and voltage generator 330 may receive a read command CMD_r. The control logic and voltage generator 330 may control the address decoder 320, the page buffer 340, and the input/output circuit 360 to perform a read operation in response to the received read command CMD_r.

The control logic and voltage generator 330 may perform a cell count comparison operation at a specific point in time of the read operation. When performing at least one of a plurality of read operations, the control logic and voltage generator 330 may perform a cell count comparison operation together. The cell count comparison operation is an operation of comparing a reference cell count with a cell count based on the read voltage. The cell count comparison circuit 331 may refer to information of the RVL LUT 111 or 211 included in the read command CMD_r to perform the cell count comparison operation. The cell count comparison circuit 331 may refer to information of read voltage level changes calculated from the RVL CAL 212. The cell count comparison circuit 331 may refer to a cell count nC provided from the cell counter 350.

In one read operation, the cell count comparison circuit 331 may compare the reference cell count with the cell count nC based on one read voltage. In the plurality of read operations, the cell count comparison circuit 331 may perform the cell count comparison operation several times. The cell count comparison circuit 331 may transmit a comparison result to the read voltage level selector 332. The read voltage level selector 332 may receive the comparison result from the cell count comparison circuit 331.

The read voltage level selector 332 may select a read voltage level through the comparison result. The read voltage level selector 332 may refer to the information of the read voltage level changes of the RVL LUT 111 to select the read voltage level. The read voltage level selector 332 may adjust at least one level of the read voltages not used in the read operation. The read voltage level selector 332 may output a new read voltage RD' having an adjusted voltage level. The cell count comparison circuit 331 and the read voltage level selector 332 may be implemented in the form of hardware.

The cell counter 350 may count a memory cell (e.g., on-cell) that forms a current path in a channel in response to the read voltage in a specific time. The cell counter 350 may count a memory cell (e.g., off-cell) that cuts off a current path of a channel in response to the read voltage in another or the same specific time. The cell counter 350 may count a memory cell (e.g., on-cell) that forms a current path in a channel or a memory cell (e.g., off-cell) that cuts off a current path of a channel in response to the read voltage in one of the plurality of read operations. The cell counter 350 may transmit the cell count nC to the control logic and voltage generator 330.

The input/output circuit 360 may provide data DATA provided from the outside to the page buffer 340. In a read operation of the nonvolatile memory device 300, the input/output circuit 360 may receive data DATA from the page buffer 340. The input/output circuit 360 may transmit the received data to the memory controller 110 or 210.

Figure 6:
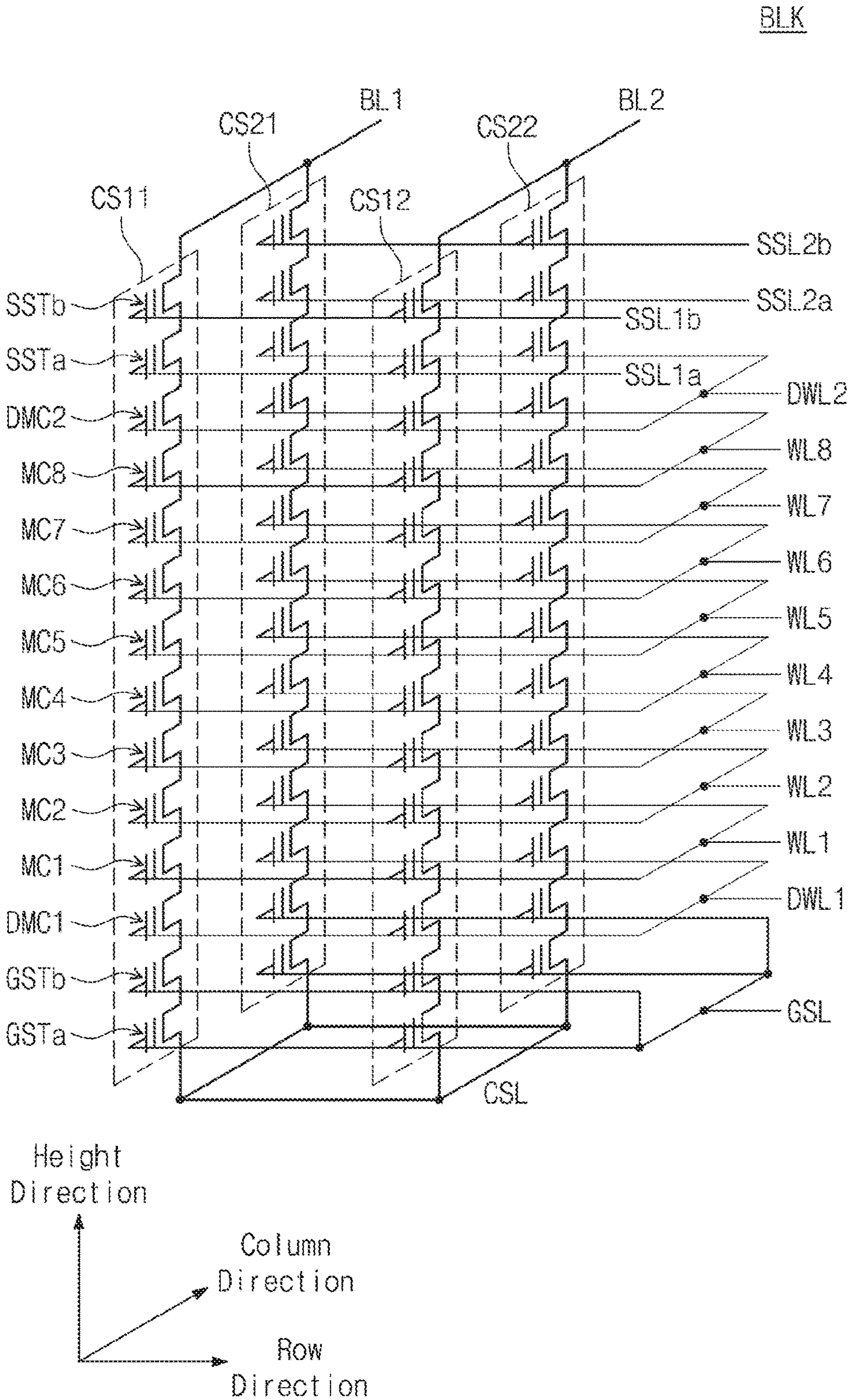
FIG. 6 is a circuit diagram illustrating a memory block according to some example embodiments of inventive concepts.

FIG. 6 is a circuit diagram describing a memory block included in a nonvolatile memory device of FIG. 5. A memory block BLKn having a three-dimensional (3D) structure will be described with reference to FIG. 6. However, inventive concepts are not limited thereto, and the remaining memory blocks BLK1 to BLKn−1 may have the same or similar structures as that of the memory block BLKn. Referring to FIG. 6, the memory block BLKn includes a plurality of cell strings CS11, CS12, CS21, and CS22. The cell strings CS11, CS12, CS21, and CS22 may be arranged along a row direction and a column direction to form rows and columns.

Each of the cell strings CS11, CS12, CS21, and CS22 may include a plurality of cell transistors. For example, each of the cell strings CS11, CS12, CS21, and CS22 may include string selection transistor SSTa and SSTb, a plurality of memory cells MC1 to MC8, ground selection transistors GSTa and GSTb, and dummy memory cell DMC1 and DMC2. In an example embodiment, each of the memory cells MC1 to MC8 included in the cell strings CS11, CS12, CS21, and CS22 may be a charge trap flash (CTF) memory cell.

In each cell string, the memory cells MC1 to MC8 may be serially connected to each other and may be stacked in a height direction that is a direction perpendicular to a plane defined by the row direction and the column direction. In each cell string, the string selection transistors SSTa and SSTb may be serially connected to each other and may be arranged between the memory cells MC1 to MC8 and a bit line BL. In each cell string, the ground selection transistors GSTa and GSTb may be serially connected to each other and may be arranged between the memory cells MC1 to MC8 and a common source line CSL.

In an example embodiment, in each cell string, a first dummy memory cell DMC1 may be arranged between the memory cells MC1 to MC8 and the ground selection transistors GSTa and GSTb. In an example embodiment, in each cell string, a second dummy memory cell DMC2 may be arranged between the memory cells MC1 to MC8 and the string selection transistors SSTa and SSTb.

The ground selection transistors GSTa and GSTb of the cell strings CS11, CS12, CS21, and CS22 may be connected in common to a ground selection line GSL. In an example embodiment, ground selection transistors in the same row may be connected to the same ground selection line, and ground selection transistors in different rows may be connected to different ground selection lines. For example, the first ground selection transistors GSTa of the cell strings CS11 and CS12 in the first row may be connected to a first ground selection line, and the first ground selection transistors GSTa of the cell strings CS21 and CS22 in the second row may be connected to a second ground selection line.

In an example embodiment, although not illustrated in FIG. 6, ground selection transistors at the same height from a substrate (not illustrated) may be connected to the same ground selection line, and ground selection transistors at different heights may be connected to different ground selection lines. For example, the first ground selection transistors GSTa of the cell strings CS11, CS12, CS21, and CS22 may be connected to the first ground selection line, and the second ground selection transistors GSTb thereof may be connected to the second ground selection line.

Memory cells of the same height from the substrate or the ground selection transistors GSTa and GSTb may be connected in common to the same word line, and memory cells of different heights therefrom may be connected to different word lines. For example, the first to eighth memory cells MC1 to MC8 in the cell strings CS11, CS12, CS21, and CS22 may be connected in common to first to eighth word lines WL1 to WL8, respectively.

First string selection transistors belonging to the same row, from among the first string selection transistors SSTa at the same height may be connected to the same string selection line, and first string selection transistors belonging to different rows may be connected to different string selection lines. For example, the first string selection transistors SSTa of the cell strings CS11 and CS12 in the first row may be connected in common to a string selection line SSL1*a*, and the first string selection transistors SSTa of the cell strings CS21 and CS22 in the second row may be connected in common to a string selection line SSL2*a*.

Likewise, second string selection transistors belonging to the same row, from among the second string selection transistors SSTb at the same height may be connected to the same string selection line, and second string selection transistors in different rows may be connected to different string selection lines. For example, the second string selection transistors SSTb of the cell strings CS11 and CS12 in the first row may be connected in common to a string selection line SSL1*b*, and the second string selection transistors SSTb of the cell strings CS21 and CS22 in the second row may be connected in common to a string selection line SSL2*b*.

Although not shown in FIG. 6, string selection transistors of cell strings in the same row may be connected in common to the same string selection line. For example, the first and second string selection transistors SSTa and SSTb of the cell strings CS11 and CS12 in the first row may be connected in common to the same string selection line. The first and second string selection transistors SSTa and SSTb of the cell strings CS21 and CS22 in the second row may be connected in common to the same string selection line.

In an example embodiment, dummy memory cells at the same height may be connected with the same dummy word line, and dummy memory cells at different heights may be connected with different dummy word lines. For example, the first dummy memory cells DMC1 may be connected with the first dummy word line DWL1, and the second dummy memory cells DMC2 may be connected with the second dummy word line DWL2.

In an example embodiment, the memory block BLKz illustrated in FIG. 6 is only example. The number of cell strings may increase or decrease, and the number of rows of cell strings and the number of columns of cell strings may increase or decrease according to the number of cell strings. Also, in the memory block BLKz, the number of cell transistors (GST, MC, DMC, SST, etc.) may increase or decrease. Also, a height of the memory block BLKn may increase or decrease according to the number of cell transistors. Furthermore, the number of lines (GSL, WL, DWL, SSL, etc.) connected with cell transistors may increase or decrease according to the number of cell transistors.

The following patent documents, which are hereby incorporated by reference, describe suitable configurations for 3D memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648, the entire disclosures of each of which are herein incorporated by reference.

Figure 7:
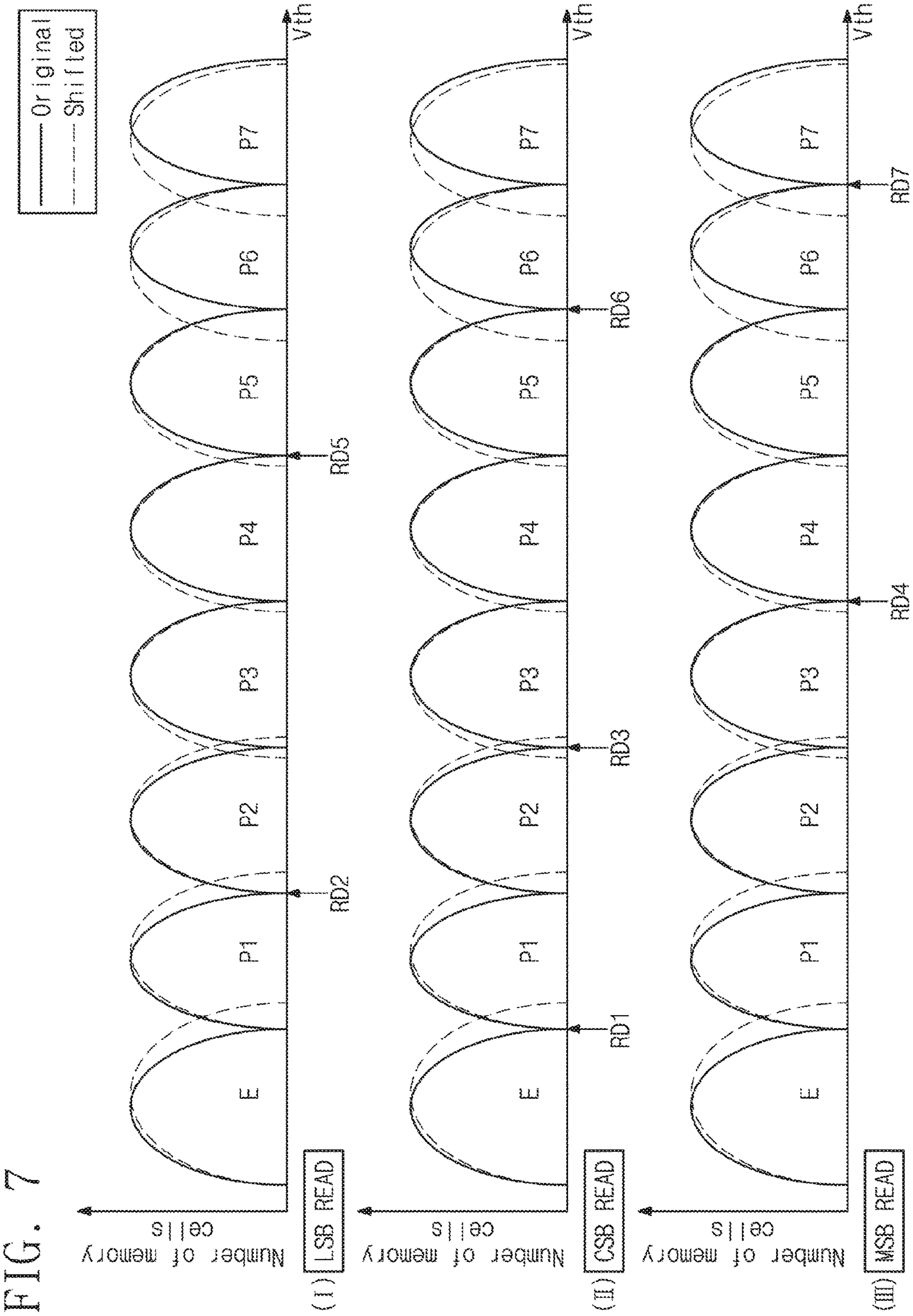

FIG. 7 is a distribution diagram describing an initial program threshold voltage distribution of memory cells and a changed threshold voltage distribution of the memory cells as time goes by. Referring to FIG. 7, a method of reading a triple level cell (TLC) capable of storing 3-bit data on a per-page basis is disclosed; however, inventive concepts are not limited thereto.

A change of a threshold voltage distribution of memory cells may be different depending on a programmed state. For example, in the case of an erase state E or a low-order program state (e.g., P1), the threshold voltage distribution tends to be shifted in a direction where threshold voltages increase. In the case of high-order program states (e.g., P6, and P7), the threshold voltage distribution tends to be shifted in a direction where threshold voltages decrease. In the case of intermediate-order program states (e.g., P2, P3, P4, and P5), there may be little or no shift in the threshold voltage distribution.

Referring to FIGS. 1, 2 and 7 together, the nonvolatile memory device 120, 220, and 300 may determine a program state of memory cells programmed using first through seventh read voltages RD1 to RD7. The first through seventh read voltages RD1 to RD7 may be generated by the control logic and voltage generator 330. Each of the first through seventh read voltages RD1 to RD7) may have a desired (or, alternatively, predetermined) voltage level to determine a program state of the programmed memory cells.

To read the least significant bit (LSB) page, the second and fifth read voltages RD2 and RD5 may be sequentially applied. The second read voltage RD2 may be used to distinguish between a state having a threshold voltage lower than a first program state P1 and a state having a threshold voltage higher than a second program state P2. The fifth read voltage RD5 may be used to distinguish between a state having a threshold voltage lower than a fourth program state P4 and a state having a threshold voltage higher than a fifth program state P5.

To read the center significant bit (CSB) page, the first, third and sixth read voltages RD1, RD3, and RD6 may be sequentially applied. The first read voltage RD1 may be used to distinguish between a state having a threshold voltage lower than the erase state E and a state having a threshold voltage higher than the first program state P1. The third read voltage RD3 may be used to distinguish between a state having a threshold voltage lower than the second program state P2 and a state having a threshold voltage higher than a third program state P3. The sixth read voltage RD6 may be used to distinguish between a state having a threshold voltage lower than the fifth program state P5 and a state having a threshold voltage higher than a sixth program state P6.

To read the most significant bit (MSB) page, the fourth and seventh read voltages RD4, and RD7 may be sequentially applied. The fourth read voltage RD4 may be used to distinguish between a state having a threshold voltage lower than the third program state P3 and a state having a threshold voltage higher than the fourth program state P4. The seventh read voltage RD7 may be used to distinguish between a state having a threshold voltage lower than the sixth program state P6 and a state having a threshold voltage higher than a seventh program state P7.

The first through seventh read voltages RD1 to RD7 of the nonvolatile memory device 300 (120, and 220) may be determined based on a stabilized threshold voltage distribution (e.g., a threshold voltage distribution after a desired (or, alternatively, predetermined) time goes by). However, as illustrated in FIG. 7, the threshold voltage distribution of the program states E to P7 may be shifted as time goes by. The program states E to P7 may also be shifted by a program disturbance, a read disturbance, and/or a coupling phenomenon. In the case of reading the programmed memory cells using the read voltages RD1 to RD7, the nonvolatile memory device 300 may read data DATA including an error. To prevent, or reduce the likelihood of, data including an error from being read, the nonvolatile memory device 300 may perform a cell count at a specific time. The nonvolatile memory device 300 may adjust at least one level of the read voltages to at least one level not used in the read operation.

Figure 8:
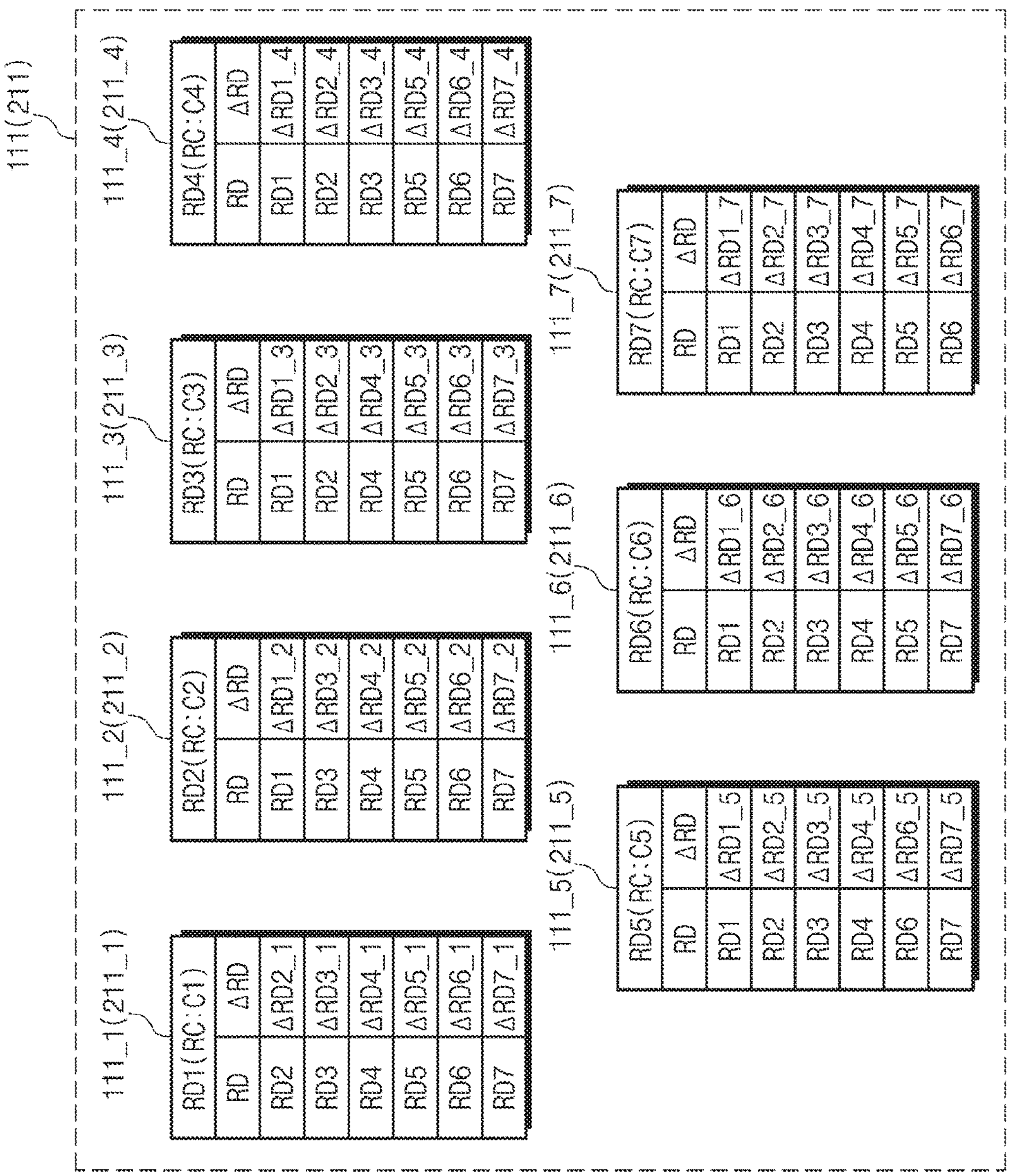
FIG. 8 is a view illustrating a read voltage level lookup table according to example embodiments of inventive concepts.

FIG. 8 is a view describing a RVL LUT according to example embodiments of inventive concepts. Referring to FIGS. 1, 2 and 8, the memory controller 110, and 210 may include the RVL LUT 111 (211). The RVL LUT 111 (211) includes mapping information on read voltage level changes according to the reference cell count.

The RVL LUT 111 (211) is a table for adjusting a read voltage on pages including a triple-level cell (TLC). This is an example for describing inventive concepts. Information included in the RVL LUT 111 (211) may become different depending on a storable bit of a page of the nonvolatile memory device 120, 220. The RVL LUT 111 may include a plurality of tables 111_1(211_1) to 111_7(211_7). The plurality of tables 111_1(211_1) to 111_7(211_7) map a plurality of read voltage level changes on the read voltages RD1 to RD7 respectively. The read voltages RD1 to RD7 may be voltages determined based on the threshold voltage distribution (e.g., stabilized threshold voltage distribution) before being shifted.

Referring to the first RVL LUT 111_1(211_1), the first read voltage RD1 is a reference cell count and has a first reference cell count C1. When a cell count comparison operation on the first read voltage RD1 is performed, the first RVL LUT 111_1(211_1) may include mapping information of the read voltages RD2 to RD7 and a plurality of read voltage level changes ΔRD2_1 to ΔRD7_1. At least one of the second through seventh read voltages RD2 to RD7 may be changed as much as a corresponding read voltage level changes among the plurality of read voltage level changes ΔRD2_1 to ΔRD7_1.

Referring to FIGS. 7 and 8, the second and third read voltage level changes ΔRD2_1, and ΔRD3_1 according to the first read voltage RD1 may be a positive value. This is because, in the case of the low-order program states P1, and P2, the threshold voltage distribution tends to be shifted in a direction where threshold voltages increase. To perform a more accurate read operation, the second and third read voltage levels RD2, and RD3 may increase. The fourth through seventh read voltage level changes ΔRD4_1 to ΔRD7_1 according to the first read voltage RD1 may be a negative value. This is because, in the case of the center program states P3 to P5 and the high-order states P6, and P7, the threshold voltage distribution tends to be shifted in a direction where threshold voltages decrease. To perform a more accurate read operation, the fourth through seventh read voltage levels RD4 to RD7 may increase. This is merely an example of inventive concepts and the plurality of read voltage level changes ΔRD2_1 to ΔRD7_1 according to the first read voltage RD1 may become different depending on a tendency where the threshold voltage distribution is shifted.

Referring to the second RVL LUT 111_2(211_2), the second read voltage RD2 is a reference cell count and has a second reference cell count C2. When a cell count comparison operation on the second read voltage RD2 is performed, the second RVL LUT 111_2(211_2)) may include mapping information of the read voltages RD1, and RD3 to RD7 and a plurality of read voltage level changes ΔRD1_2, and ΔRD3_2 to ΔRD7_2. At least one of the first and third through seventh read voltages RD1, and RD3 to RD7 may be changed as much as a corresponding read voltage level changes among the plurality of read voltage level changes ΔRD1_2, and ΔRD3_2 to ΔRD7_2.

Referring to FIGS. 7 and 8, the first and third read voltage level changes ΔRD1_2, and ΔRD3_2 according to the second read voltage RD2 may be a positive value. The fourth through seventh read voltage level changes ΔRD4_2 to ΔRD7_2 according to the second read voltage RD2 may be a negative value. This is merely an example of inventive concepts and the plurality of read voltage level changes (ΔRD1_2, ΔRD3_2, and ΔRD4_2 to ΔRD7_2) according to the second read voltage RD2 may become different depending on a tendency where the threshold voltage distribution is shifted.

Referring to the third RVL LUT 111_3(211_3), the third read voltage RD3 is a reference cell count and has a third reference cell count C3. When a cell count comparison operation on the third read voltage RD3 is performed, the third RVL LUT 111_3(211_3) may include mapping information of the read voltages RD1, RD2, and RD4 to RD7 and a plurality of read voltage level changes ΔRD1_3, ΔRD2_3, and ΔRD4_3 to ΔRD7_3. At least one of the first, second, fourth through seventh read voltages RD1, RD2, and RD4 to RD7 may be changed as much as a corresponding read voltage level changes among the plurality of read voltage level changes ΔRD1_3, ΔRD2_3, ΔRD4_3 to ΔRD7_3.

Referring to FIGS. 7 and 8, the first and second read voltage level changes ΔRD1_3, and ΔRD2_3 according to the third read voltage RD3 may be a positive value. The fourth through seventh read voltage level changes ΔRD4_3 to ΔRD7_3 according to the third read voltage RD3 may be a negative value. This is merely an example of inventive concepts and the plurality of read voltage level changes ΔRD1_3, ΔRD2_3, and ΔRD4_3 to ΔRD7_3 according to the third read voltage RD3 may become different depending on a tendency where the threshold voltage distribution is shifted.

Referring to the fourth RVL LUT 111_4(211_4), the fourth read voltage RD4 is a reference cell count and has a fourth reference cell count C4. When a cell count comparison operation on the fourth read voltage RD4 is performed, the fourth RVL LUT 111_4(211_4) may include mapping information of the read voltages RD1 to RD3, and RD5 to RD7 and a plurality of read voltage level changes ΔRD1_4 to ΔRD3_4, and ΔRD5_4 to ΔRD7_4. At least one of the first through third and fifth through seventh read voltages RD1 to RD3, and RD5 to RD7 may be changed as much as a corresponding read voltage level changes among the plurality of read voltage level changes ΔRD1_4 to ΔRD3_4, and ΔRD5_4 to ΔRD7_4.

Referring to FIGS. 7 and 8, the first through third read voltage level changes ΔRD1_4 to ΔRD3_4 according to the fourth read voltage RD4 may be a positive value. The fifth through seventh read voltage level changes ΔRD5_4 to ΔRD7_4 according to the fourth read voltage RD4 may be a negative value. This is merely an example of inventive concepts and the plurality of read voltage level changes ΔRD1_4 to ΔRD3_4, and ΔRD5_4 to ΔRD7_4 according to the fourth read voltage RD4 may become different depending on a tendency where the threshold voltage distribution is shifted.

Referring to the fifth RVL LUT 111_5(211_5), the fifth read voltage RD5 is a reference cell count and has a fifth reference cell count C5. When a cell count comparison operation on the fifth read voltage RD5 is performed, the fifth RVL LUT 111_5(211_5) may include mapping information of the read voltages RD1 to RD4, RD6, and RD7 and a plurality of read voltage level changes ΔRD1_5 to ΔRD4_5, ΔRD6_5, and ΔRD7_5. At least one of the first through third and fifth through seventh read voltages RD1 to RD4, RD6, and RD7 may be changed as much as a corresponding read voltage level changes among the plurality of read voltage level changes ΔRD1_5 to ΔRD4_5, ΔRD6_5, and ΔRD7_5.

Referring to FIGS. 7 and 8, the first through third read voltage level changes ΔRD1_5 to ΔRD3_5 according to the fifth read voltage RD5 may be a positive value. The fourth, sixth, and seventh read voltage level changes ΔRD5_4, ΔRD6_5, and ΔRD7_5 according to the fifth read voltage RD5 may be a negative value. This is merely an example of inventive concepts and the plurality of read voltage level changes ΔRD1_5 to ΔRD4_5, ΔRD6_5, and ΔRD7_5 according to the fifth read voltage RD5 may become different depending on a tendency where the threshold voltage distribution is shifted.

Referring to the sixth RVL LUT 111_6(211_6), the sixth read voltage RD6 is a reference cell count and has a sixth reference cell count C6. When a cell count comparison operation on the sixth read voltage RD6 is performed, the sixth RVL LUT 111_6(211_6) may include mapping information of the read voltages RD1 to RD5, and RD7 and a plurality of read voltage level changes ΔRD1_6 to ΔRD5_6, and ΔRD7_6. At least one of the first through fifth and seventh read voltages RD1 to RD5, and RD7 may be changed as much as a corresponding read voltage level changes among the plurality of read voltage level changes ΔRD1_6 to ΔRD5_6, and ΔRD7_6.

Referring to FIGS. 7 and 8, the first through third read voltage level changes ΔRD1_6 to ΔRD3_6 according to the sixth read voltage RD6 may be a positive value. The fourth, fifth, and seventh read voltage level changes ΔRD4_6, ΔRD5_6, and ΔRD7_6 according to the sixth read voltage RD6 may be a negative value. This is merely an example of inventive concepts and the plurality of read voltage level changes ΔRD1_6 to ΔRD5_6, and ΔRD7_6 according to the sixth read voltage RD6 may become different depending on a tendency where the threshold voltage distribution is shifted.

Referring to the seventh RVL LUT (111_7(211_7)), the seventh read voltage RD7 is a reference cell count and has a seventh reference cell count C7. When a cell count comparison operation on the seventh read voltage RD7 is performed, the seventh RVL LUT 111_7(211_7) may include mapping information of the read voltages RD1 to RD6 and a plurality of read voltage level changes ΔRD1_7 to ΔRD6_7. At least one of the first through sixth read voltages RD1 to RD6 may be changed as much as a corresponding read voltage level changes among the plurality of read voltage level changes ΔRD1_7 to ΔRD6_7.

Referring to FIGS. 5 and 7, the first through third read voltage level changes ΔRD1_7 to ΔRD3_7 according to the seventh read voltage RD7 may be a positive value. The fourth through sixth read voltage level changes ΔRD4_7, to ΔRD6_7 according to the seventh read voltage RD7 may be a negative value. This is merely an example of inventive concepts and the plurality of read voltage level changes ΔRD1_7 to ΔRD6_7 according to the seventh read voltage RD7 may become different depending on a tendency where the threshold voltage distribution is shifted.

Referring to FIGS. 7 and 8, each of the plurality of reference cell counts C1 to C7 may be a value to minimize occurrence probability of an error in a read operation. Each of the plurality of reference cell counts C1 to C7 may also be a value to minimize the sum of the number of errors and occurrence probability of an error in a read operation. Information included in the RVL LUT 111(211) is transmitted to the nonvolatile memory device 120, and 220 together with the read command CMD_r.

FIG. 9 is a table describing a characteristic of a cell count comparison operation which is selectively applied according to example embodiments of inventive concepts. Referring to FIG. 9, a read sequence for applying a read voltage level adjustment according to a cell count comparison operation among read operations of pages of a triple level cell (TLC) is classified according to page. A plurality of read operations may be performed on each of the pages.

Referring to FIG. 9 together with FIG. 7, the second and fifth read voltages RD2, and RD5 may be sequentially applied to the memory cell array 310 to perform a read operation of a page of the least significant bit (LSB). The first and third read voltages RD1, and RD3 may be sequentially applied to the memory cell array 310 to perform a read operation of a page of the center significant bit (CSB). A cell count operation and a cell count comparison operation may be performed before the sixth read voltage RD6 is applied.

The cell counter 350 may perform a cell count operation with reference to the third read voltage RD3. The cell counter 350 may transmit a cell count nC on the third read voltage RD3 to the cell count comparison circuit 331. The cell count comparison circuit 331 may perform a cell count comparison operation at a desired (or, alternatively, predetermined) moment. The cell count comparison circuit 331 may also perform a cell count comparison operation in response to the control signal CNTL of the controller 110, and 210.

After the third read voltage RD3 is applied, the cell count comparison circuit 331 may perform a cell count comparison operation. To perform the cell count comparison operation, the cell count comparison circuit 331 may refer to the cell count nC provided from the cell counter 350. The cell counter 350 may count the number of on-cells or off-cells among memory cells having the third program state P3 in response to the third read voltage RD3.

To perform the cell count comparison operation, the cell count comparison circuit 331 may refer to information of the RVL LUT 111_3(211_3) on the third read voltage RD3. The cell count comparison circuit 331 may refer to information of read voltage level changes calculated from the RVL CAL 212. The cell count comparison circuit 331 may compare the third reference cell count C3 on the third read voltage RD3 with the cell count nC on the third read voltage RD3.

When the cell count nC is an on-cell count, if the third reference cell count C3 is greater than the cell count nC on the third read voltage RD3 and a difference between the third reference cell count C3 and the cell count nC on the third read voltage RD3 is greater than a reference value, the cell count comparison circuit 331 may output a signal that controls the read voltage level selector 332. When the cell count nC is an off-cell count, if the third reference cell count C3 is greater than the cell count nC on the third read voltage RD3 and a difference between the third reference cell count C3 and the cell count nC on the third read voltage RD3 is less than the reference value, the cell count comparison circuit 331 may output a signal that controls the read voltage level selector 332. In this way, the cell count comparison circuit 331 may output a signal that controls the read voltage level selector 332 according to a comparison result of the cell count nC on the third read voltage RD3 and the third reference cell count C3.

The read voltage level selector 332 may output a new sixth read voltage (RD6'=RD6+ΔRD6_3) obtained by adding the sixth read voltage level changes ΔRD6_3 to the sixth read voltage RD6. The new sixth read voltage RD6' may be used as a read voltage on data stored in memory cell of the memory cell array 310. In a read operation of a center significant bit (CSB) page, the new sixth read voltage RD6' may be applied to the memory cell array 310 instead of the sixth read voltage RD6. To perform a read operation of a most significant bit (MSB) page, the fourth and seventh read voltages RD4, and RD7 may be sequentially applied to the memory cell array 310.

Figure 10:
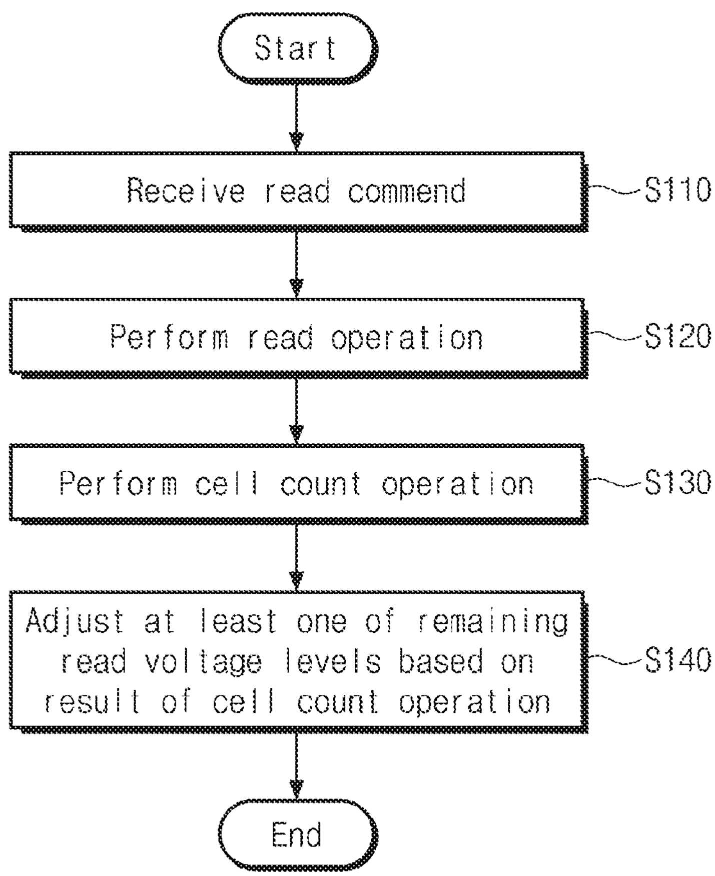
FIG. 10 is a flowchart describing a cell count comparison operation according to the sequence described in FIG. 8.

FIG. 10 is a flowchart describing a cell count comparison operation according to the sequence described in FIG. 9. Referring to FIGS. 1, 2, 5 and 10, in S110, the nonvolatile memory device 300(120, and 220) may receive the read command CMD_r from the memory controller 110, and 210. The read command CMD_r may include information of the RVL LUT 111(211). The read command CMD_r may include information of read voltage level changes calculated from the RVL CAL 212. In operation S120, the nonvolatile memory device 300(120, and 220) may perform a read operation in response to the read command CMD_r.

In operation S130, the nonvolatile memory device 300 (120, and 220) may perform a cell count operation and a cell count comparison operation. The nonvolatile memory device 300(120, and 220) may perform a cell count operation and a cell count comparison operation on a read voltage among a plurality of read voltages.

In operation S140, the nonvolatile memory device 300 (120, and 220) may adjust at least one level of the read voltages not used in the read operation with reference to the RVL LUT 111(211) and the cell count nC. The nonvolatile memory device 300(120, and 220) may adjust at least one level of the read voltages not used in the read operation with reference to information of read voltage level changes calculated from the RVL CAL 212 and the cell count nC. When a cell count on a read voltage among the plurality of read voltages goes beyond the specified range, the nonvolatile memory device 300(120, and 220) may adjust at least one level of the read voltages not used in the read operation.

FIG. 11 is a table describing a characteristic of a cell count comparison operation which is selectively applied according to example embodiments of inventive concepts. Referring to FIGS. 1, 2, 5 and 11, to perform a read operation of a page of the least significant bit (LSB), the second read voltage RD2 may be applied to the memory cell array 310. A cell count operation and a cell count comparison operation may be performed before the fifth read voltage RD5 is applied. The cell counter 350 may perform a cell count operation on the second read voltage RD2. The cell counter 350 may transmit a cell count nC on the second read voltage RD2 to the cell count comparison circuit 331. The cell counter 350 may perform an on-cell count operation or an off-cell count operation on the second read voltage RD2.

To perform a cell count comparison operation, the cell count comparison circuit 331 may refer to information of the RVL LUT 111_2(211_2) on the second read voltage RD2. The cell count comparison circuit 331 may compare the second reference cell count C2 on the second read voltage RD2 with the cell count nC on the second read voltage RD2.

According to a comparison result, the cell count comparison circuit 331 may output a signal that controls the read voltage level selector 332. According to a control signal, the read voltage level selector 332 may output a new fifth read voltage (RD5'=RD5+ΔRD5_2) obtained by adding the fifth read voltage level changes ΔRD5_2 to the fifth read voltage RD5. In a read operation of a page of the center significant bit (CSB) of FIG. 11, a cell count operation and a cell count comparison operation may be performed in concurrence with a read operation by the third read voltage RD3. As the cell count operation and the cell count comparison operation are performed in concurrence with the read operation by the third read voltage RD3, total read operation time may be reduced. To perform the cell count comparison operation, the cell count comparison circuit 331 may refer to information of the RVL LUT 111_1(211_1) on the first read voltage RD1.

The cell counter 350 may transmit a cell count nC on the first read voltage RD1 to the cell count comparison circuit 331. The cell count comparison circuit 331 may compare the first reference cell count C1 on the first read voltage RD1 with the cell count nC on the first read voltage RD1. A new sixth read voltage RD6' may be applied to memory cells instead of the sixth read voltage RD6 by the cell count comparison operation. The new sixth read voltage RD6' is a value obtained by adding read voltage level changes ΔRD6_1 to the sixth read voltage RD6.

Figure 12:
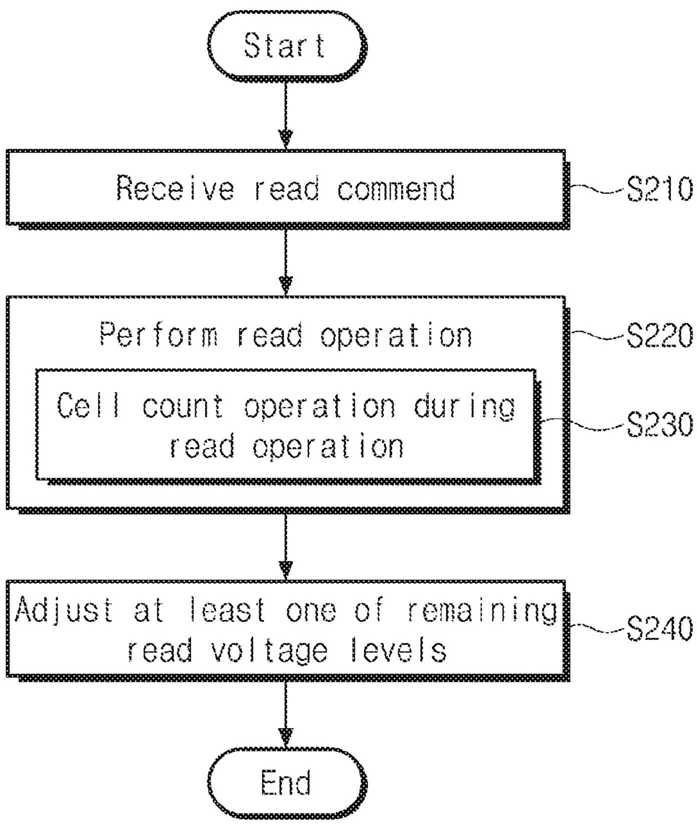
FIG. 12 is a flowchart describing a cell count comparison operation according to the sequence described in FIG. 10.

FIG. 12 is a flowchart describing a cell count comparison operation according to the sequence described in FIG. 11. Referring to FIGS. 1, 2, 5, 11 and 12, in operation S210, the nonvolatile memory device 300(120, and 220) may receive a read command CMD_r from the memory controller 110, and 210. The read command CMD_r may include information of the RVL LUT 111(211). The read command CMD_r may include information of the read voltage level changes calculated from the RVL CAL 212.

In operation S220, the nonvolatile memory device 300 (120, and 220) may perform a read operation in response to the read command CMD_r. In operation S230, the nonvolatile memory device 300(120, and 220) may perform a cell count operation and a cell count comparison operation during the read operation. In operation S240, the nonvolatile memory device 300(120, and 220) may adjust levels of the read voltages not used in the read operation with reference to the RVL LUT 111(211) and a cell count nC. According to a comparison result of the cell count, the nonvolatile memory device 120 may reflect the read voltage level changes of the RVL LUT 111 in the read voltage and may perform the read operation. The nonvolatile memory device 300(120, and 220) may adjust levels of the read voltages not used in the read operation with reference to the information of the read voltage level changes calculated from the RVL CAL 212 and the cell count nC.

FIG. 13 is a table describing a characteristic of a cell count comparison operation which is selectively applied according to example embodiments of inventive concepts. Referring to FIGS. 1, 2, 5 and 13, the second read voltage RD2 may be applied to perform a read operation of the least significant bit (LSB). After the second read voltage RD2 is applied, a cell count operation and a cell count comparison operation may be performed. As a result of cell count comparison, when a cell count nC on the second read voltage RD2 is within a specified range, the read voltage level selector 332 may output the fifth read voltage RD5.

A process of a read operation of a page of the center significant bit (CSB) of FIG. 13 may be the same as or similar to that of FIG. 11. A cell count operation and a cell count comparison operation on the first read voltage RD1 may be performed together with a read operation on the third read voltage RD3. As a result of cell count comparison, when a cell count nC on the first read voltage RD1 is within a specified range, the read voltage level selector 332 may output the sixth read voltage RD6.

The fourth read voltage RD4 may be applied to perform a read operation of a page of the most significant bit (MSB). After the fourth read voltage RD4 is applied, the cell count operation and the cell count comparison operation may be performed. A level of the seventh read voltage RD7 may be adjusted according to a result of the cell count comparison operation. After a read operation of a page of the center significant bit (CSB) is completed, the read operation of the page of the most significant bit (MSB) is performed.

The fourth read voltage RD4 may be applied to the memory cell array 310 to perform the read operation of the page of the most significant bit (MSB). A cell count operation and a cell count comparison operation on the fourth read voltage RD4 may be performed. A new seventh read voltage RD7' is applied to the memory cell array 310 instead of the seventh read voltage RD7 according to a comparison result. The new seventh read voltage RD7' is a value obtained by adding read voltage level changes ΔRD7_4 to the seventh read voltage RD7.

Figure 14:
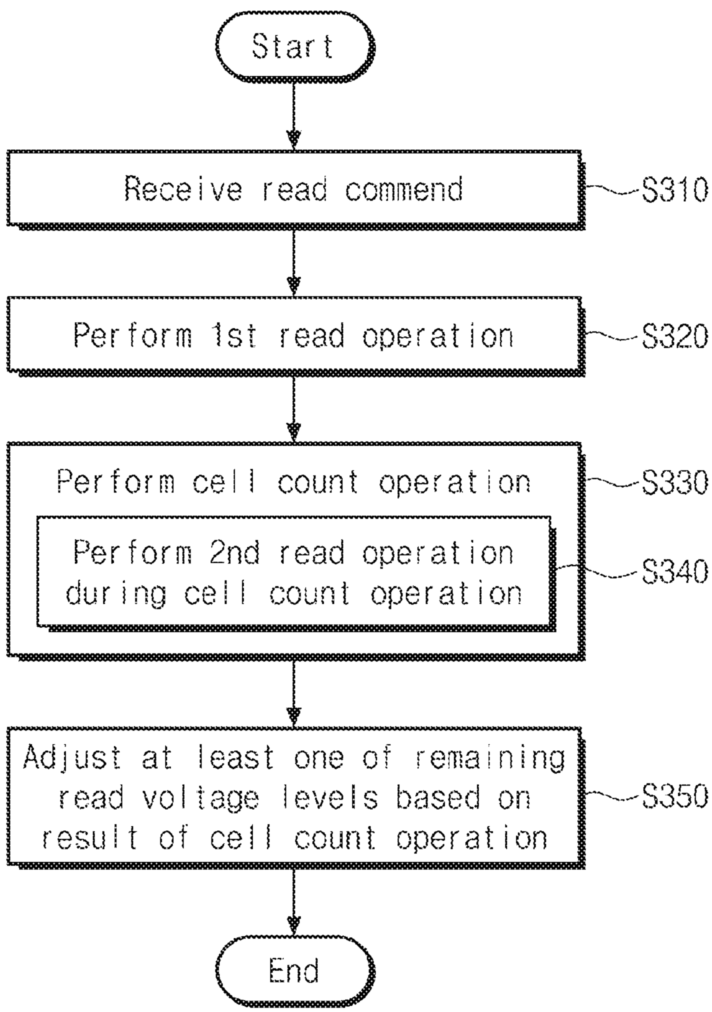
FIG. 14 is a flowchart describing a cell count comparison operation according to the sequence described in FIG. 12.

FIG. 14 is a flowchart describing a cell count comparison operation according to the sequence described in FIG. 13. Referring to FIGS. 1, 2, 5, 13 and 14, in operation S310, the nonvolatile memory device 300(120, and 220) may receive a read command CMD_r from the memory controller 110, and 210. The read command CMD_r may include information of the RVL LUT 111(211). The read command CMD_r may include information of the read voltage level changes calculated from the RVL CAL 212. In operation S320, the nonvolatile memory device 300(120, and 220) may perform a first read operation in response to the read command CMD_r.

In operation S330, the nonvolatile memory device 300 (120, and 220) may perform a cell count operation and a cell count comparison operation. The nonvolatile memory device 300(120, and 220) may perform a cell count operation and a cell count comparison operation on a read voltage applied to perform the first read operation. In operation S340, the nonvolatile memory device 300(120, and 220) may perform a second read operation during the cell count operation and the cell count comparison operation. The nonvolatile memory device 300(120, and 220) may perform the second read operation while performing the cell count operation and the cell count comparison operation on the read voltage applied to perform the first read operation.

In operation S350, the nonvolatile memory device 300 (120, and 220) may adjust at least one level of the read voltages not used in the read operation with reference to the RVL LUT 111(211) and the cell count nC. The nonvolatile memory device 300(120, and 220) may adjust at least one level of the read voltages not used in the read operation with reference to information of read voltage level changes calculated from the RVL CAL 212 and the cell count nC. When a cell count on a read voltage applied to perform the first read operation goes beyond the specified range, the nonvolatile memory device 300(120, and 220) may adjust at least one level of the read voltages not used in the read operation.

FIG. 15 is a table describing a characteristic of a cell count comparison operation which is selectively applied according to example embodiments of inventive concepts. Referring to FIGS. 11 and 15, processes of read operation by the third read voltage RD3 of a page of the center significant bit (CSB) may be the same as or similar to each other. Levels of the sixth read voltage RD6 and the seventh read voltage RD7 may be adjusted according to the cell count comparison operation. After the third read voltage RD3 is applied, a new sixth read voltage RD6' may be applied. The fourth read voltage RD4 may be applied to perform a read operation of a page of the most significant bit (MSB). A new seventh read voltage RD7' is applied instead of the seventh read voltage RD7. Referring to FIG. 15, a level of at least one read voltage may be adjusted through the cell count comparison operation.

Referring to FIGS. 9, and 11 through 15, a cell count operation and a cell count comparison operation may be performed at least once in each page having a plurality of bits (LSB~MSB). At least one of an on-cell count operation and an off-cell count operation may be performed depending on a program state of memory cells. The on-cell count operation may be performed on memory cell programmed to the low-order program states P1, and P2. The off-cell count operation may be performed on memory cell programmed to the high-order program states P6, and P7. The on-cell count operation or the off-cell count operation may be performed on all the read voltages RD1 to RD7. The on-cell count operation or the off-cell count operation may also be performed on some of the read voltages RD1 to RD7.

The cell count comparison operation may be performed not only in a read operation by the third read voltage RD3, but also in read operations by the other read voltages RD1, RD2, and RD4 to RD7.

Levels of the read voltages RD1 to RD7 may be adjusted through the cell count comparison operation. For example, levels of high-order read voltages (e.g., RD6, and RD7) where a threshold voltage distribution is greatly shifted may be adjusted.

As described above, the levels of the read voltages are adjusted and thereby a read error of the nonvolatile memory device 120 may be reduced. The read error may be reduced and thereby data reliability of the nonvolatile memory device 120 may be improved.

Figure 16:
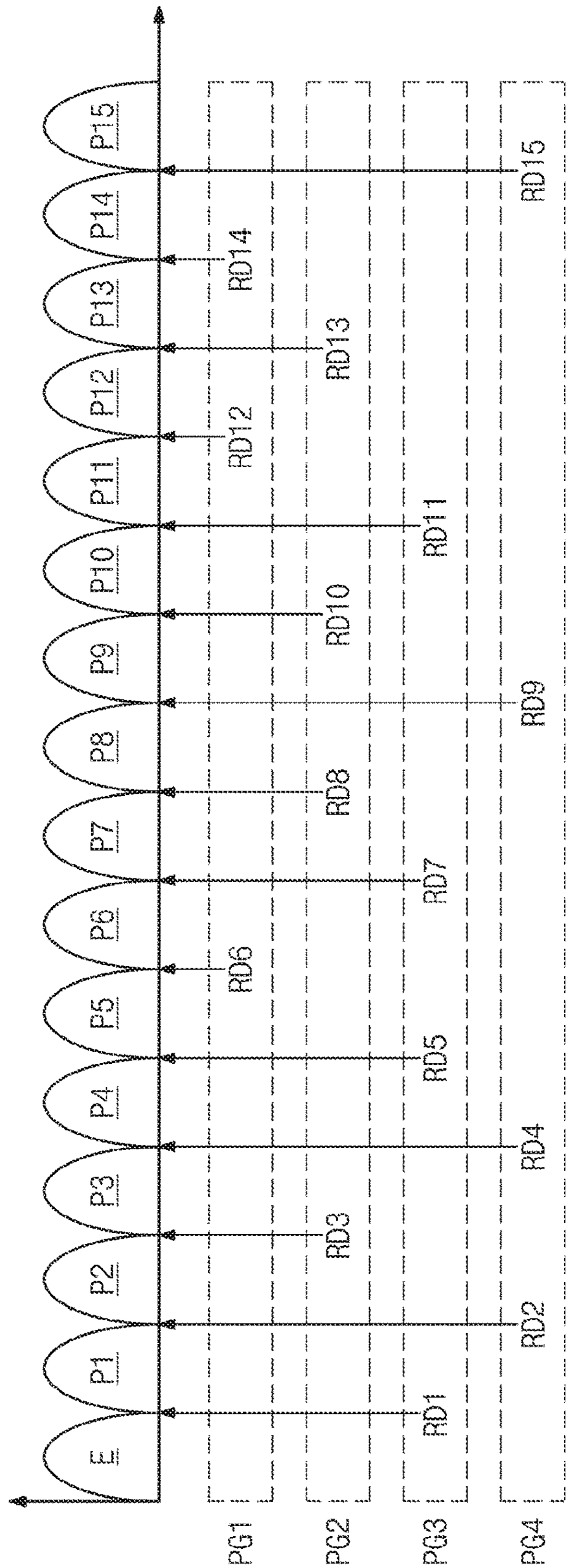
FIG. 16 is a distribution diagram illustrating a threshold voltage distribution of memory cells according to some example embodiments of inventive concepts.

FIG. 16 is a distribution diagram illustrating a threshold voltage distribution of memory cells according to example embodiments of inventive concepts. For brief description, each of memory cells of the nonvolatile memory device 120 may be assumed a QLC (Quadruple Level Cell) storing 4-bit data. That is, memory cells connected to one word line may store data regarding first through fourth pages PG1 to PG4. However, the scope of inventive concepts is not limited thereto.

Referring to FIGS. 1 and 16, each of the memory cells of the nonvolatile memory device 120 may be programmed to have any one state of an erase state E and first through fifteenth program states P1 to P15. Similar to that described above, the nonvolatile memory device 120 may read data stored in the memory cells by determining states of the memory cells based on first through fifteenth read voltages RD1 to RD15.

For example, the nonvolatile memory device 120 may read data of the first page PG1 based on the sixth, twelfth and fourteenth read voltages RD6, RD12 and RD14, read data of the second page PG2 based on the third, eighth, tenth and thirteenth read voltages RD3, RD8, RD10 and RD13, read data of the third page PG3 based on the first, fifth, seventh and eleventh read voltages RD1, RD5, RD7 and RD11, and read data of the fourth page PG4 based on the second, fourth, ninth and fifteenth read voltages RD2, RD4, RD9 and RD15.

The first through fourth pages PG1 to PG4 may be a LSB page, a first CSB page, a second CSB page, and a MSB page respectively. The first through fourth pages PG1 to PG4 may indicate logical page data programmed in the memory cells connected to one word line. However, the scope of inventive concepts is not limited thereto but read voltages with respect to each page may be variously changed according to a bit ordering.

Figure 17:
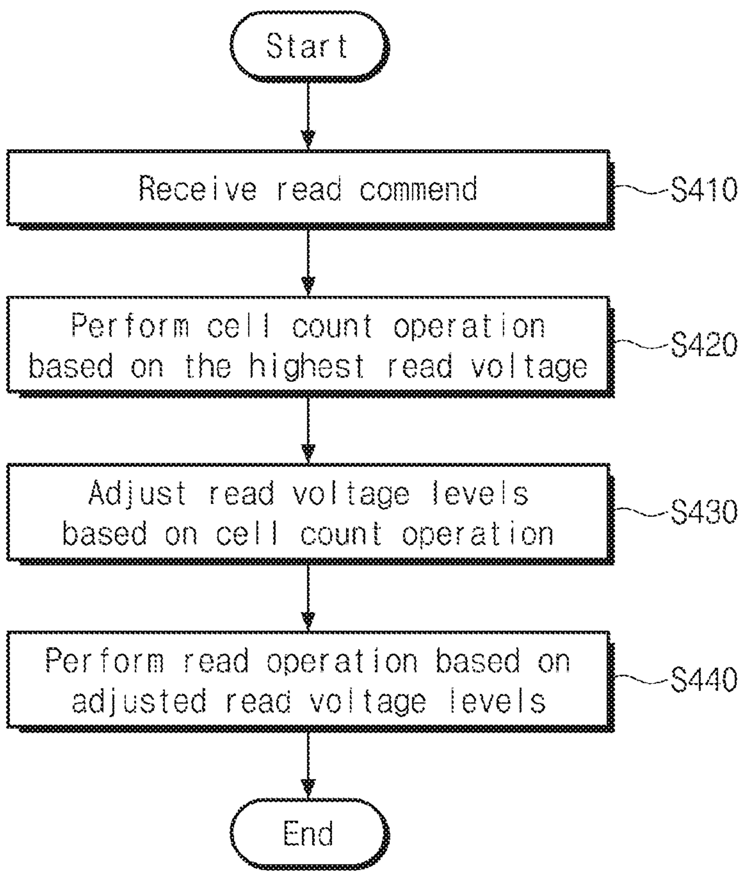
FIG. 17 is a flow chart describing a read operation of a nonvolatile memory device according to some example embodiments of inventive concepts.

FIG. 17 is a flow chart describing a read operation of a nonvolatile memory device according to some example embodiments of inventive concepts. Referring to FIGS. 1, 16 and 17, in operation S410, the nonvolatile memory device 120 may receive a read command.

In operation S420, the nonvolatile memory device 120 may perform the cell count operation based on the most significant read voltage (e.g., the fifteenth read voltage RD15) or a read voltage corresponding to the most significant program state (e.g., the fifteenth program state P15). Since the cell count operation was described above, a description thereof is omitted.

In operation S430, the nonvolatile memory device 120 may adjust levels of the read voltages based on a result of the cell count operation. In operation S440, the nonvolatile memory device 120 may perform a read operation based on the adjusted read voltages.

The embodiments described above perform the cell count operation based on a specific read level being performed during the read operation and adjust or correct levels of the read voltages to be used later based on the result of the cell count operation. However, according to the example embodiment of FIG. 17, the cell count may be performed based on a specific level (e.g., a read level corresponding to the most significant program state) and a read voltage of the overall read levels may be adjusted based on a cell count result.

For brevity of description, the read operation performed based on the adjusted read voltage is referred to as a single-sensing read operation. Performing the single-sensing read operation indicates an operation of reading a state of memory cells based on the read voltage adjusted according to various operations.

Figure 18A:
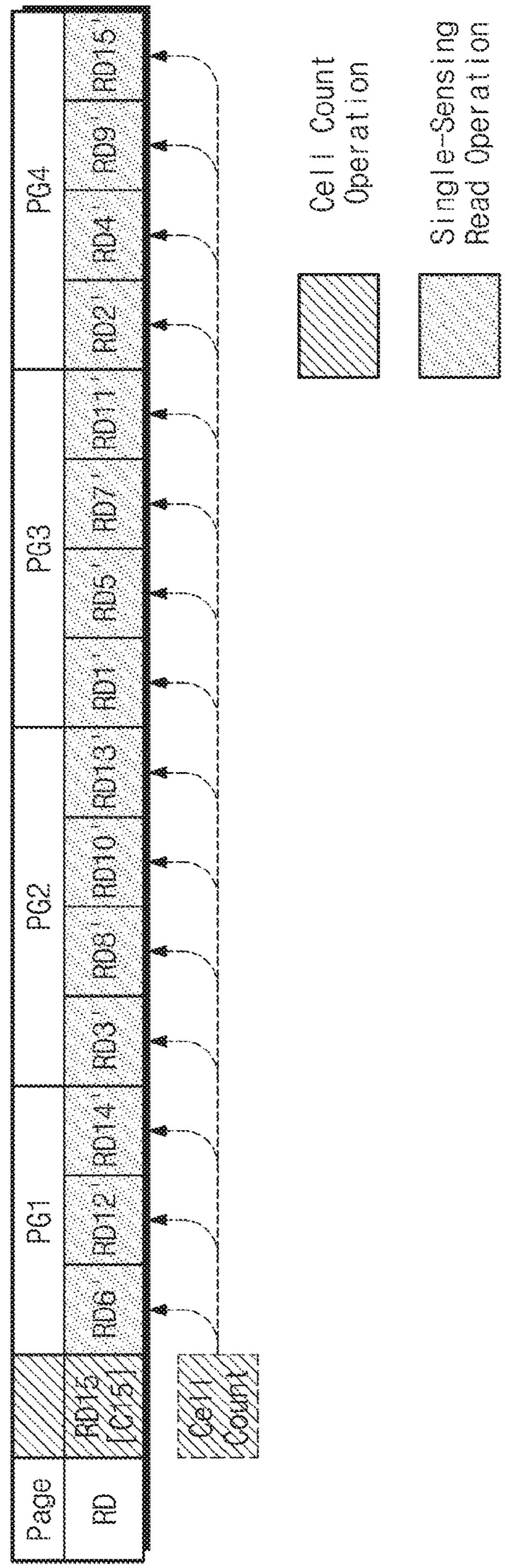
FIGS. 18A and 18B are views for explaining an operation method according to FIG. 17.
Figure 18B:
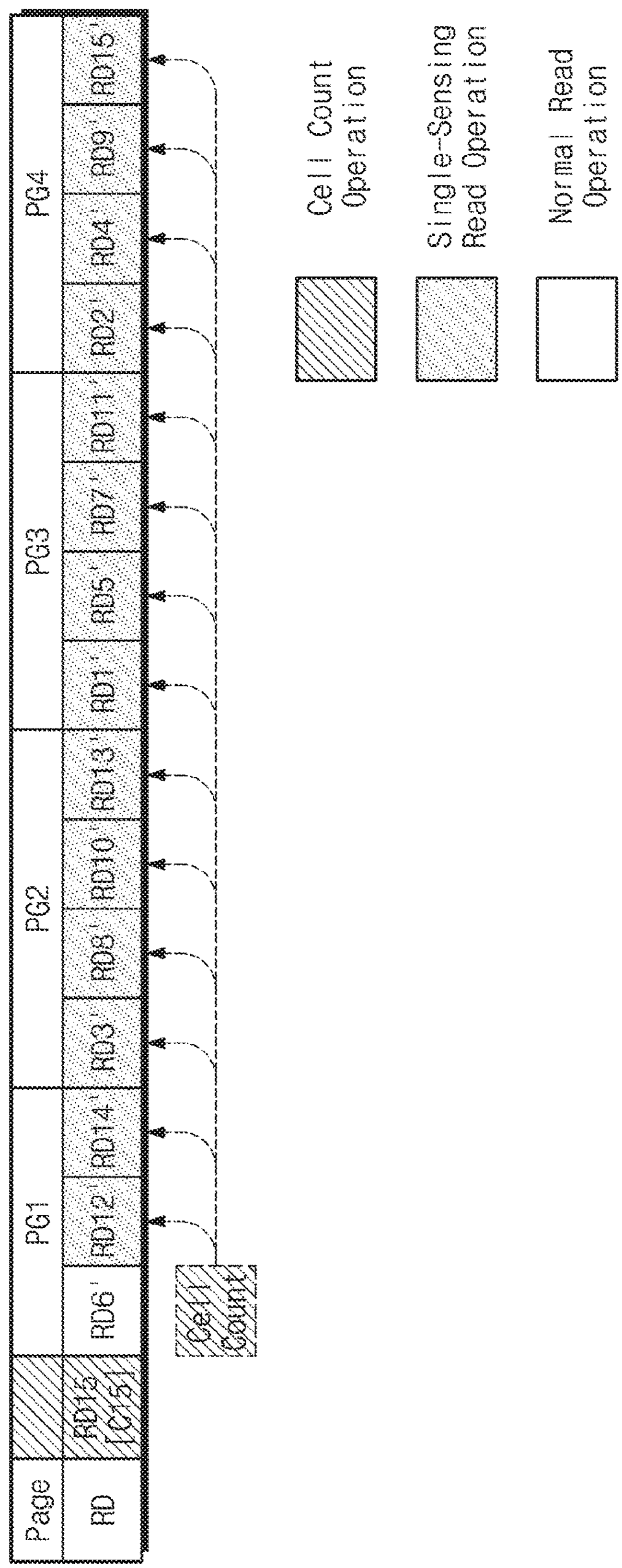

FIGS. 18A and 18B are views for explaining an operation method according to FIG. 17. For brevity of description, constituent elements that are not necessary or used when explaining the operation method of FIG. 17 are omitted. A detailed description of the operation method or the constituent elements described above is omitted.

Referring to FIGS. 1, 16 and 18A, the nonvolatile memory device 120 may sequentially perform a read operation for the first through fourth pages PG1 to PG4 in response to a read command CMD_r from the memory controller 110. An order of the read operation for each page or an order of the read voltages in the read operation for each page is merely an example and the scope of inventive concepts is not limited thereto.

The nonvolatile memory device 120 may perform the cell count operation based on the fifteenth read voltage RD15 (i.e., read voltage corresponding to the most significant program state P15) before performing the read operation for the first page PG1 in response to the read command CMD_r. The nonvolatile memory device 120 may adjust the first through fifteenth read voltages RD1 to RD15 based on information of an RVL LUT 111 received from the memory controller 110 and the cell count result. For example, similar to that described with reference to FIG. 7, the RVL LUT 111 may include a reference cell count C15 with respect to the fifteenth read voltage RD15 and an offset value of each of the first through fifteenth read voltages RD1 to RD15 according to the reference cell count C15. The nonvolatile memory device 120 may determine an offset of each of the first through fifteenth read voltages RD1 to RD15 based on the information of the RVL LUT 111, and the cell count result and may adjust a level of each of the first through fifteenth read voltages RD1 to RD15 based on the determined offset.

The nonvolatile memory device 120 may sequentially perform the single-sensing read operation for the first through fourth pages PG1 to PG4 based on the adjusted first through fifteenth read voltages RD1' to RD15'.

Referring to FIGS. 1, 16 and 18B, similar to FIG. 18A, the nonvolatile memory device 120 may perform the cell count operation based on the fifteenth read voltage RD15 before performing the read operation for the first page PG1 in response to the read command CMD_r. In this case, the nonvolatile memory device 120 may detect a state of the memory cells based on the fifteenth read voltage RD15 before the read operation for the first page PG1 is performed and may perform the cell count operation while performing read operation for the first page PG1. In further detail, the nonvolatile memory device 120 may determine a state of the memory cells based on the sixth read voltage RD6 and at the same time, may calculate the number of on-cells or off-cells based on a state of the memory cells determined before (e.g., the state of the memory cells determined based on the fifteenth read voltage RD15). The nonvolatile memory device 120 may adjust levels of the remaining read voltages (RD1 to RD5, RD8 to RD15) based on the cell count result.

Referring to FIGS. 17 through 18B, the cell count operation for the read voltage (i.e., fifteenth read voltage RD15) corresponding to the most significant program state (i.e., fifteenth program state P15) was described but the scope of inventive concepts is not limited thereto. The cell count operation may be performed based on the read voltage (i.e., first read voltage RD1) corresponding to an erase state E or a read voltage corresponding to other program state. The cell count result may indicate the number of off-cells or the number of on-cells.

As described above, the nonvolatile memory device 120 according to example embodiments of inventive concepts may perform the cell count operation based on a specific read voltage and may adjust levels of all or part of the read voltages based on the cell count operation before performing an actual read operation for each page in response to the read command CMD_r.

Figure 19:
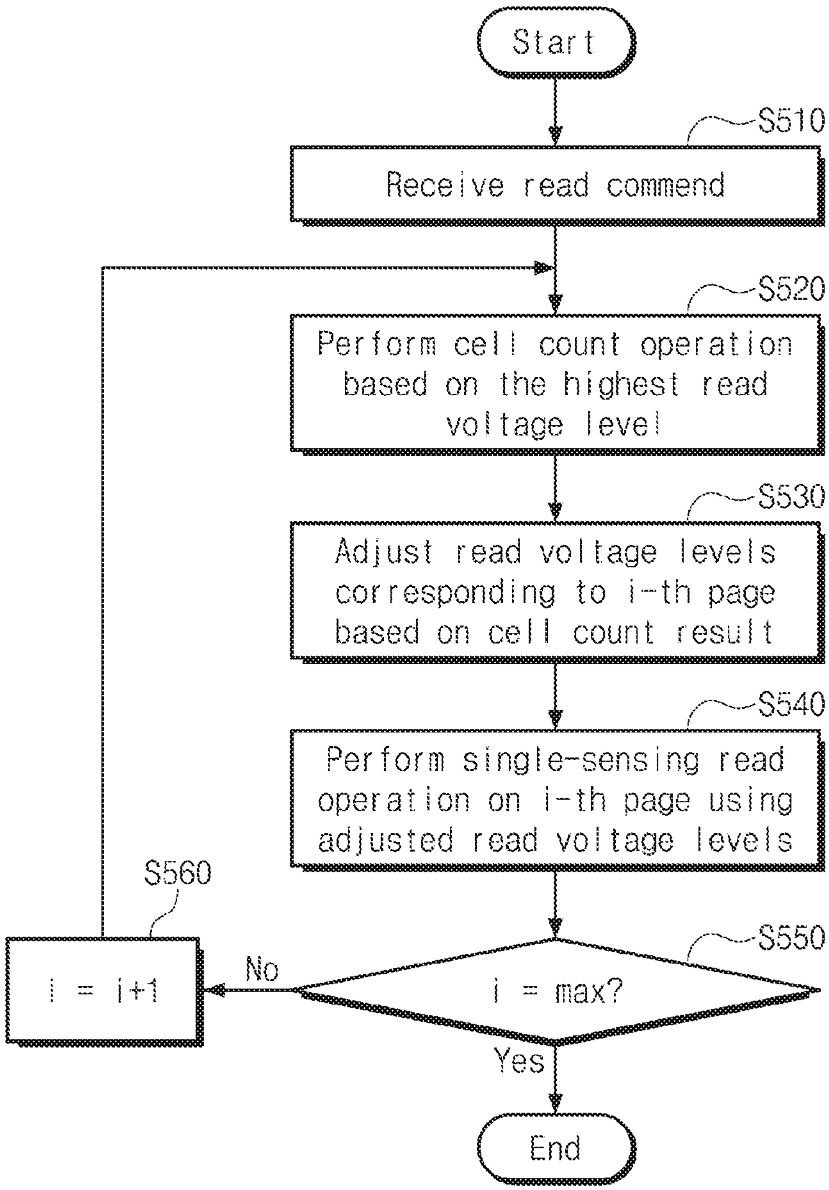
FIG. 19 is a flow chart describing a read operation of a nonvolatile memory device according to some inventive concepts.

FIG. 19 is a flow chart describing a read operation of a nonvolatile memory device according to inventive concepts. Referring to FIGS. 1 and 19, the nonvolatile memory device 120 may perform operations of operations S510 and S520. Since the operations of steps S510 and S520 are similar to the operations of the steps S410 and S420, a description thereof is omitted.

In operation S530, the nonvolatile memory device 120 may adjust read voltage levels corresponding to an i-th page (the i is simply a variable for explaining a repetitive operation). For example, when the nonvolatile memory device 120 reads the first page PG1, as illustrated in FIG. 16, the nonvolatile memory device 120 may adjust levels of the sixth, twelfth and fourteenth read voltages RD6, RD12 and RD14 corresponding to the first page PG1.

In operation S540, the nonvolatile memory device 120 may perform a single-sensing read operation for the i-th page using the adjusted read voltages. For example, the nonvolatile memory device 120 may perform a single-sensing read operation for the first page using the adjusted sixth, twelfth and fourteenth read voltages RD6', RD12' and RD14'.

In operation S550, the nonvolatile memory device 120 may determine whether i is the maximum value. That is, the nonvolatile memory device 120 may determine whether a read operation for all the pages connected to one word line is completed.

When a variable i does not have the maximum value, in operation S560, a value of the variable i increases by 1 and the nonvolatile memory device 120 may perform operations of the steps S520 to S540. When a read operation for each page is performed, the nonvolatile memory device 120 may perform a cell count based on a specific level (e.g., a read voltage corresponding to the most significant program state), and may perform a single-sensing operation for each page by adjusting read voltages corresponding to each page based on a result of the cell count.

Figure 20:
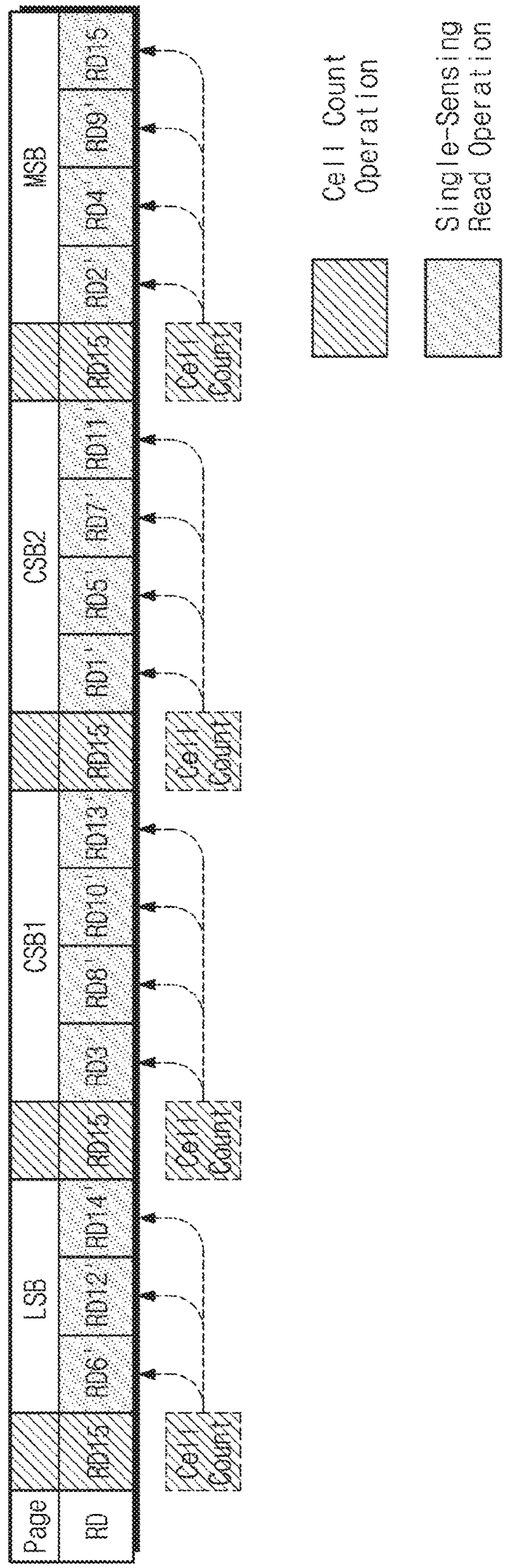
FIG. 20 is view for explaining an operation method of FIG. 19.

FIG. 20 is view for explaining an operation method of FIG. 19. For brevity of description, constituent elements that are not necessary or used when explaining the operation method of FIG. 19 are omitted. Referring to FIGS. 1, 16 and 20, the nonvolatile memory device 120 may perform read operations for the first through fourth pages PG1 to PG4 in response to the read command CMD_r. In this case, the nonvolatile memory device 120 may perform the cell count operation based on the fifteenth read voltage RD15 and may adjust read voltages corresponding to each page based on a result of the cell count operation before a read operation for each page is performed.

For example, the nonvolatile memory device 120 may perform the cell count operation based on the fifteenth read voltage RD15 before a read operation for the first page PG1 is performed. The nonvolatile memory device 120 may adjust levels of the sixth, twelfth and fourteenth read voltages RD6, RD12 and RD14 corresponding to the first page PG1 based on the cell count result. After that, the nonvolatile memory device 120 may perform a single-sensing read operation for the first page PG1 based on the adjusted sixth, twelfth, and fourteenth read voltages RD6', RD12' and RD14'.

Similarly, the nonvolatile memory device 120 may perform the cell count operation based on the fifteenth read voltage RD15 and may adjust voltages [RD3, RD8, RD10, RD13], [RD1, RD5, RD7, RD11], [RD2, RD4, RD9, RD15] corresponding to the second through fourth pages PG2 to PG4 respectively based on a result of the cell count operation before read operations for the second through fourth pages PG2 to PG4 are performed. The nonvolatile memory device 120 may perform a single-sensing read operation for the second through fourth pages PG2 to PG4 based on the adjusted voltages [RD3', RD8', RD10', RD13'], [RD1', RD5', RD7', RD11'], [RD2', RD4', RD9', RD15'].

The cell count operation for each page may be performed based on the first read voltage RD1 corresponding to the erase state E or a read voltage corresponding to other program state. However, the scope of inventive concepts is not limited thereto.

According to embodiments of FIGS. 19 and 20, unlike the embodiments of FIGS. 17 through 18B, a cell count operation for adjusting read voltages corresponding to each page may be performed before the read operation for each page is performed. Although not illustrated in the drawing, the cell count-based read voltage adjusting operation described above may be performed only on some pages. For example, to adjust read voltages corresponding to the first and second pages PG1 and PG2, a cell count operation is performed once and then to adjust read voltages corresponding to the third and fourth pages PG3 and PG4, a cell count operation is performed once.

Figure 21:
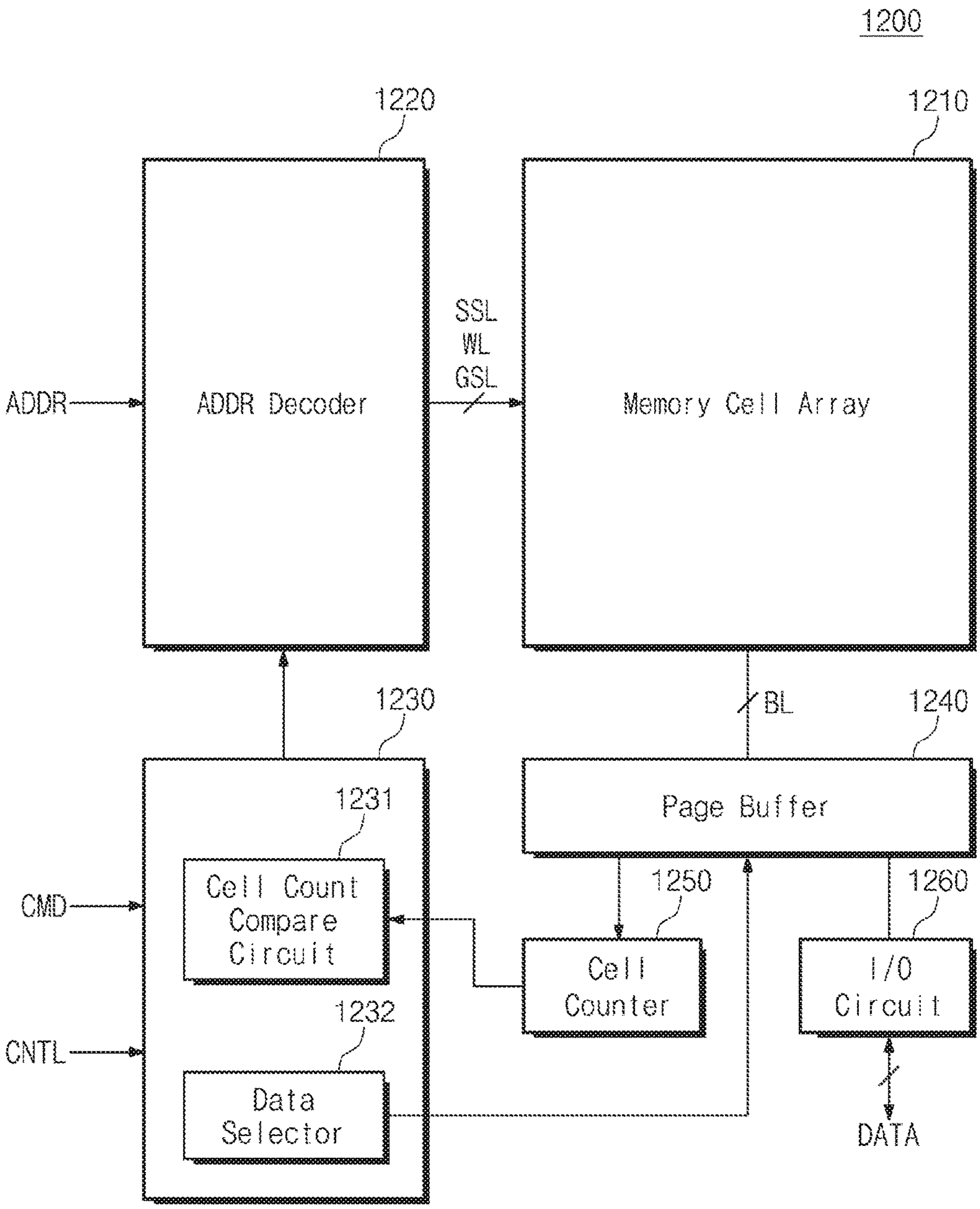
FIG. 21 is a block diagram illustrating a nonvolatile memory device according to some example embodiments of inventive concepts.

FIG. 21 is a block diagram illustrating a nonvolatile memory device according to example embodiments of inventive concepts. Referring to FIG. 21, a nonvolatile memory device 1200 may include a memory cell array 1210, an address decoder 1220, a control logic and voltage generator 1230, a page buffer 1240, a cell counter 1250, and an input/output circuit 1260. Since the memory cell array 1210, the address decoder 1220, the control logic and voltage generator 1230, the page buffer 1240, the cell counter 1250, and the input/output circuit 1260 were described with reference to FIG. 5, a description thereof is omitted.

The control logic and voltage generator 1230 may include a cell count comparison circuit 1231 and a data selector 1232. The cell count comparison circuit 1231 may receive a cell count nC and compare the received cell count nC. The cell count comparison circuit 1231 may also compare the received cell count nC to generate a plurality of counting information.

The data selector 1232 may select and output any one from among a plurality of data stored in the page buffer 1240 based on the plurality of counting information from the cell count comparison circuit 1231.

For example, the nonvolatile memory device 1200 may perform a read operation using at least two read voltages to determine one program state. For example, the nonvolatile memory device 1200 may determine states of memory cells based on the at least two read voltages to divide the fourteenth and fifteenth program states P14 and P15. At least two read data may be generated by the at least two read voltages.

The data selector 1232 may select any one from among at least two data so that any one of the at least two data is output through the input/output circuit 1260 based on the plurality of counting information from the cell count comparison circuit 1231. A method in which data is selected by the data selector 1232 will be described in further detail with reference to FIG. 24.

For convenience of explanation, an operation is referred to as 'multi-sensing read operation' which reads states of memory cells based on at least two voltages and selects one of at least two data generated by a reading result to output the selected data in order to divide adjacent two program states. That is, the multi-sensing read operation may be similar to an on-chip valley search operation.

Figure 22:
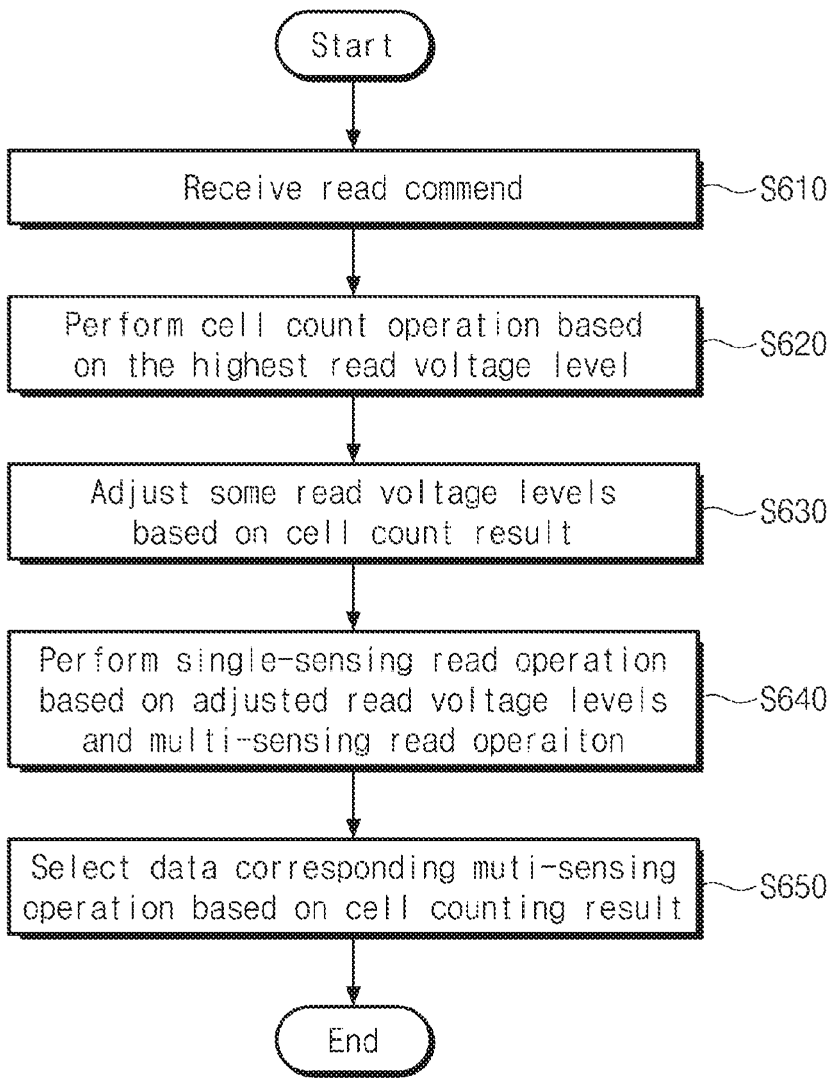
FIG. 22 is a flow chart describing an operation of a nonvolatile memory device of FIG. 21.

FIG. 22 is a flow chart describing an operation of a nonvolatile memory device of FIG. 21. Referring to FIGS. 21 and 22, operations of steps S610 and S620 may be performed. Since the operations of steps S610 and S620 are similar to the operations of the steps S410 and S420, a detailed description thereof is omitted.

In operation S630, the nonvolatile memory device 1200 may adjust levels of some read voltages based on a cell count result. For example, the nonvolatile memory device 1200 may adjust levels of read voltages corresponding to low-order program states based on the cell count result.

In operation S640, the nonvolatile memory device 1200 may perform a single-sensing read operation and perform a multi-sensing read operation based on the adjusted read voltages. For example, the nonvolatile memory device 1200 may perform may perform a single-sensing read operation with respect to low-order program states and perform a multi-sensing read operation with respect to high-order program states based on the adjusted read voltages.

In operation S650, the nonvolatile memory device 1200 may select data corresponding to the multi-sensing read operation based on the cell count result. For example, as described above, when the multi-sensing read operation was performed, a plurality of data may be generated. The nonvolatile memory device 1200 may select any one from among the plurality of data generated by the multi-sensing read operation, and the selected data may be output to the outside.

Figure 23:
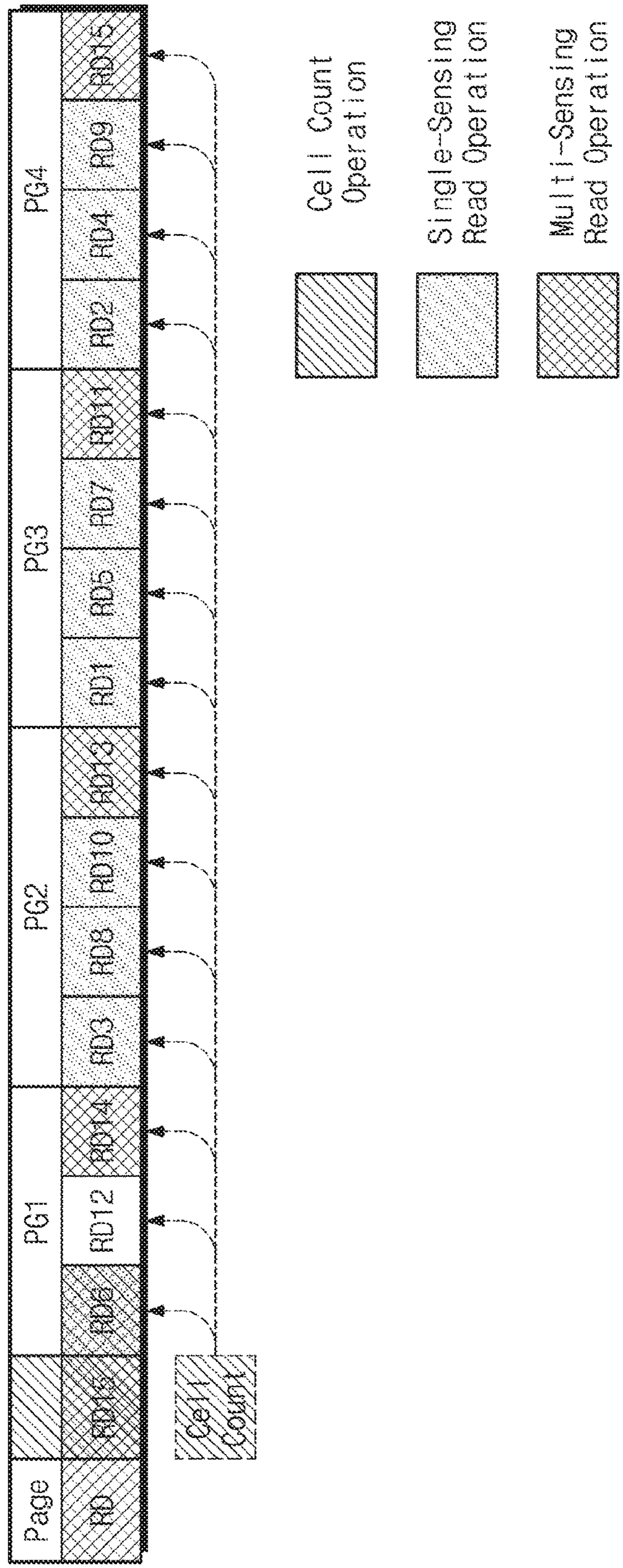
FIG. 23 is a view for explaining an operation method of FIG. 22.

FIG. 23 is a view for explaining an operation method of FIG. 22. For brevity of description, constituent elements that are not necessary or used when explaining the operation method of FIG. 22 and a detailed description thereof are omitted.

Referring to FIGS. 21 through 23, the nonvolatile memory device 1200 may perform a cell count operation based on the fifteenth read voltage RD15 before performing a read operation for the first through fourth pages PG1 to PG4 in response to the read command CMD_r. The nonvolatile memory device 1200 may adjust read voltages corresponding to the low-order program states based on the cell count result. The low-order program states may indicate the erase state E and the first through tenth program states P1 to P10 but the scope of inventive concepts is not limited thereto.

The nonvolatile memory device 1200 may perform the corresponding single-sensing read operation based on the adjusted read voltages. The multi-sensing read operation may be performed on the remaining read voltages. For example, the nonvolatile memory device 1200 may perform a read operation based on the adjusted sixth read voltage RD6' in the read operation for the first page PG1. After that, the nonvolatile memory device 1200 may perform the multi-sensing read operation with respect to the twelfth and fourteenth read voltages RD12 and RD14.

Similarly, the nonvolatile memory device 1200 may perform a single-level read operation with respect to the second through fourth pages PG2 to PG4 respectively based on the adjusted read voltages. A multi-level read operation may be performed with respect to non-adjusted read voltages.

After that, the nonvolatile memory device 1200 may select any one from among a plurality of data generated by the multi-level sensing operations based on the cell count result. The multi-sensing read operation and the data selection operation are described in further detail with reference to FIGS. 24A and 24B.

Figure 24A:
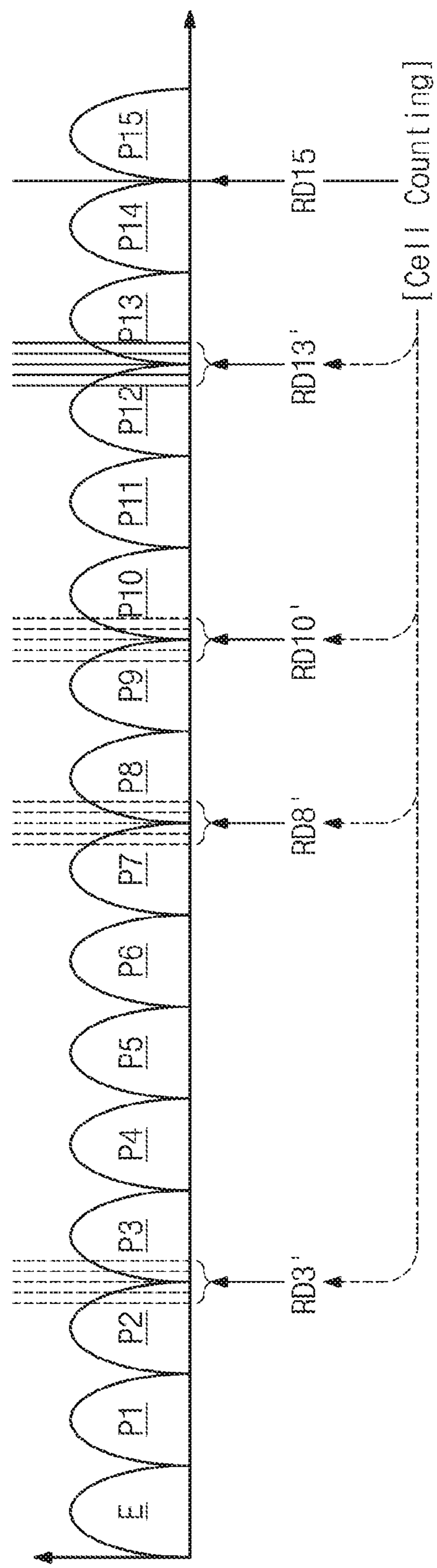
FIGS. 24A and 24B are views for explaining a multi-sensing read operation.
Figure 24B:
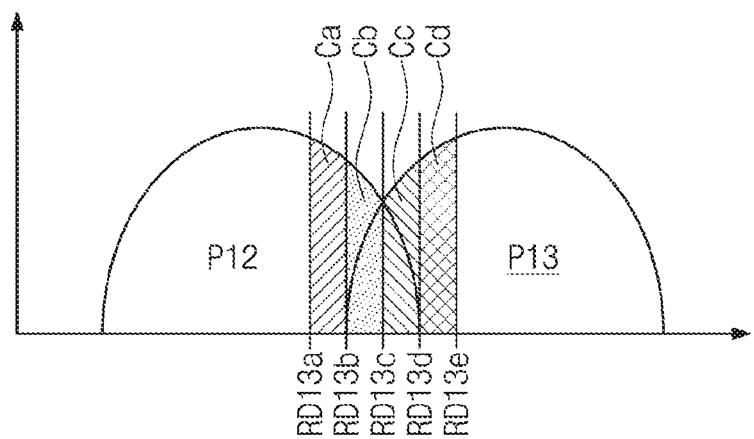

FIGS. 24A and 24B are views for explaining a multi-sensing read operation. For brevity of description, the multi-sensing read operation is described based on a read operation for a first CSB page with reference to FIG. 24A.

Referring to FIGS. 21 and 24A, the nonvolatile memory device 1200 may perform a cell count operation based on the fifteenth read voltage RD15. The nonvolatile memory device 1200 may adjust levels of the third, eighth, and tenth read voltages RD3, RD8 and RD10 based on the cell count result. The nonvolatile memory device 1200 may perform a corresponding single-level read operation based on the adjusted third, eighth, and tenth read voltages RD3', RD8' and RD10'. The adjusted third, eighth, and tenth read voltages RD3', RD8' and RD10' used in the single-level read operation may be any one of values illustrated by a dotted line in FIG. 24A.

The nonvolatile memory device 1200 may perform a multi-level read operation with respect to the thirteenth read voltage RD13. As described above, the multi-level read operation indicates an operation of reading states of memory cells based on at least two voltages to determine adjacent two program states.

For example, as illustrated in FIG. 24B, the nonvolatile memory device 1200 reads states of the memory cells based on a plurality of read voltages RD13*a* to RD13*e* to determine the twelfth and thirteenth program states P12 and P13 and thereby a plurality of data may be generated. The plurality of data (i.e., states of the memory cells) read by the plurality of read voltages RD13*a* to RD13*e* may be different from each other. In this case, the nonvolatile memory device 1200 may select any one form among the plurality of data based on the cell count result.

As a further detailed example, when the cell count result indicates that the number of off-cells is determined to be smaller than a reference value, a distribution of threshold voltages of the memory cells is in an overall lowered state. In this case, data read by a relatively lower read voltage (e.g., RD13*a*) among the plurality of read voltages RD13*a* to RD13*e* may be selected. However, when the cell count result indicates that the number of off-cells is determined to be greater than the reference value, a distribution of threshold voltages of the memory cells is in an overall heightened state (or in a relatively less lowered state). In this case, data read by a relatively higher read voltage (e.g., RD13*e*) among the plurality of read voltages RD13*a* to RD13*e* may be selected. As an illustration, according to the distribution diagram illustrated in FIG. 24B, data read by the 'RD13*c*' is selected.

A data selection by a multi-sensing read operation may be done based on data generated by the multi-sensing read operation. For example, the cell count comparison circuit 1231 of FIG. 21 may generate the plurality of counting information based on data generated by each of the plurality of read voltages RD13*a* to RD13*e*. The plurality of counting information may correspond to the number of cells Ca, the number of cells Cb, the number of cells Cc, and the number of cells Cd respectively illustrated in FIG. 24B. The number of cell Ca may indicate the number of memory cells having a threshold voltage between the read voltages RD13*a* and RD13*b*, the number of cell Cb may indicate the number of memory cells having a threshold voltage between the read voltages RD13*b* and RD13*c*, the number of cell Cc may indicate the number of memory cells having a threshold voltage between the read voltages RD13*c* and RD13*d*, and the number of cell Cd may indicate the number of memory cells having a threshold voltage between the read voltages RD13*d* and RD13*e*.

For example, by comparing sizes of the number of cells Ca, the number of cells Cb, the number of cells Cc, and the number of cells Cd with one another, an improved or optimum read voltage ('RD13*c*' in FIG. 24B) may be determined and data (e.g., data read by the improved read voltage) corresponding to the determined optimum read voltage may be selected as data to be output.

As described above, the nonvolatile memory device 1200 according to inventive concepts may perform a cell count operation based on a specific voltage before a read operation, and may adjust a read voltage based on a cell count result or perform a multi-sensing read operation. Thus, a nonvolatile memory device having improved reliability may be provided.

Figure 25:
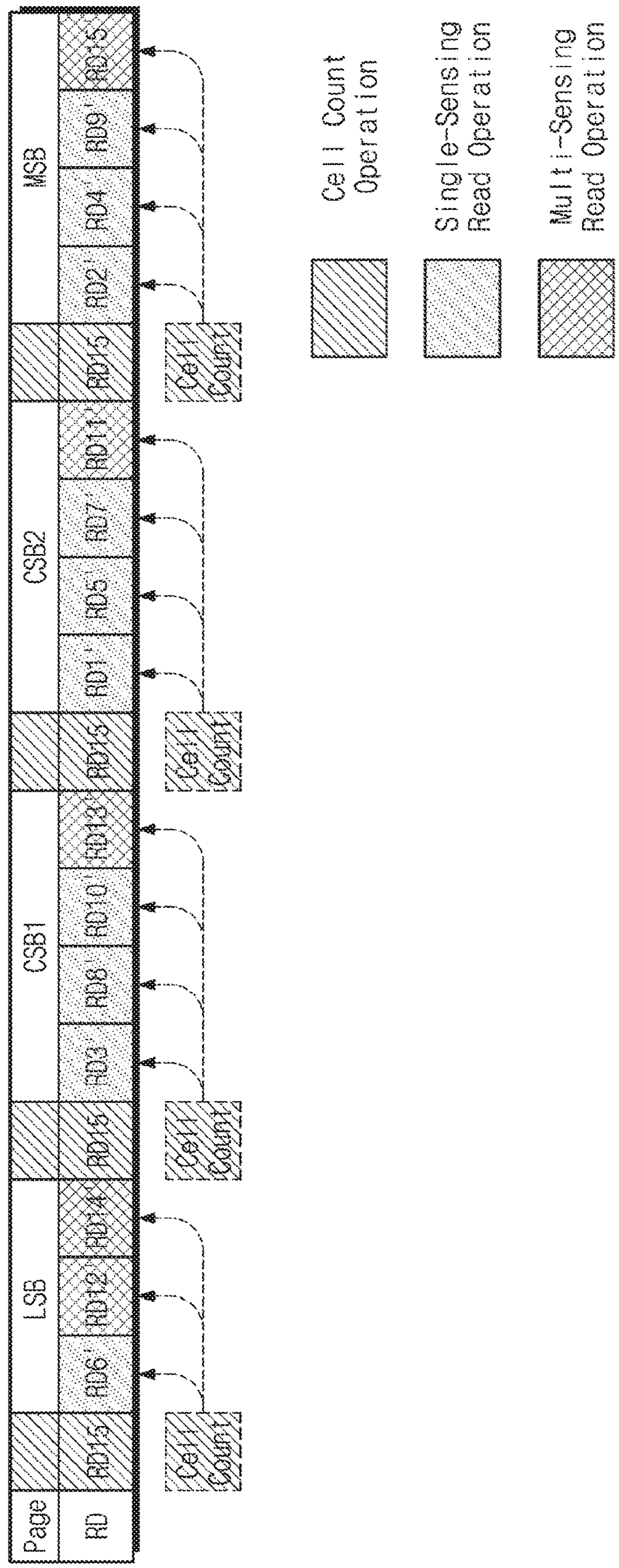
FIG. 25 is a view for explaining a read operation of a nonvolatile memory device of FIG. 21.

FIG. 25 is a view for explaining a read operation of a nonvolatile memory device of FIG. 21. For brevity of description, constituent elements that are not necessary or overlapped and a detailed description thereof are omitted.

Referring to FIGS. 21 and 25, the nonvolatile memory device 1200 may perform a cell count operation based on the fifteenth read voltage RD15 before performing read operations with respect to the first through fourth pages PG1 to PG4 in response to the read command CMD_r respectively. The nonvolatile memory device 1200 may adjust levels of some read voltages to perform a single-sensing read operation and a multi-sensing read operation based on the cell count operation. Since the adjustment of the read voltage, the single-sensing read operation, and the multi-sensing read operation were described before, a detailed description thereof is omitted.

Unlike the embodiment of FIG. 23, the embodiment of FIG. 25 may perform a cell count operation before a read operation is performed with respect to each page, and may adjust a level of a read voltage based on a cell count result to perform single-sensing read operation and a multi-sensing read operation.

Figure 26:
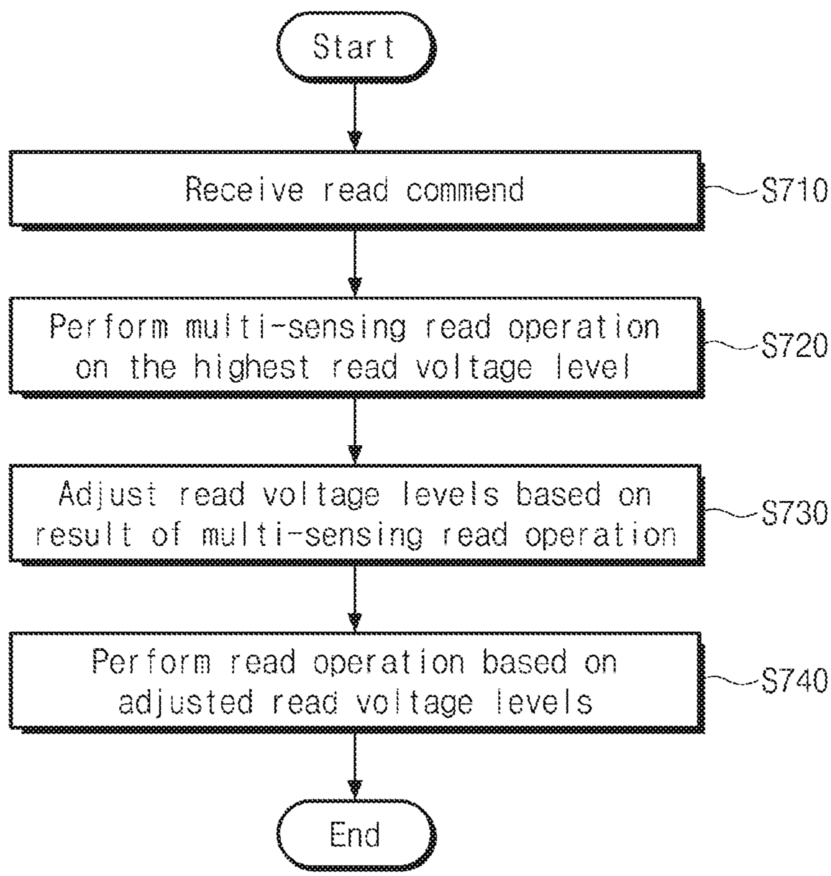
FIG. 26 is a flow chart describing an operation of a nonvolatile memory device of FIG. 21.

FIG. 26 is a flow chart describing an operation of a nonvolatile memory device of FIG. 21. Referring to FIGS. 21 and 26, in operation S710, the nonvolatile memory device 1200 may receive a read command. In operation S720, the nonvolatile memory device 1200 may perform a multi-sensing read operation with respect to the most significant program state. For example, the nonvolatile memory device 1200 may perform the multi-sensing read operation described with reference to FIG. 24 based on voltages adjacent to the fifteenth read voltage RD15.

In operation S730, the nonvolatile memory device 1200 may adjust levels of the read voltage based on a result of the multi-sensing read operation. For example, a specific read voltage may be selected by the multi-sensing read operation and data generated by the selected read voltage may be output as output data. In this case, the selected read voltage may be an improved or optimum read voltage. As an illustration, other read voltages may be adjusted according to a difference between the improved read voltage and the original read voltage (e.g., fifteenth read voltage RD15).

Alternatively, other read voltages may be adjusted based on a cell count result by the improved read voltage. As a result of the multi-sensing read operation, a plurality of counting information may be generated and other read voltages may be adjusted based on the plurality of counting information.

In operation S740, the nonvolatile memory device 1200 may perform a single-sensing read operation based on the adjusted read voltages.

Figure 27:
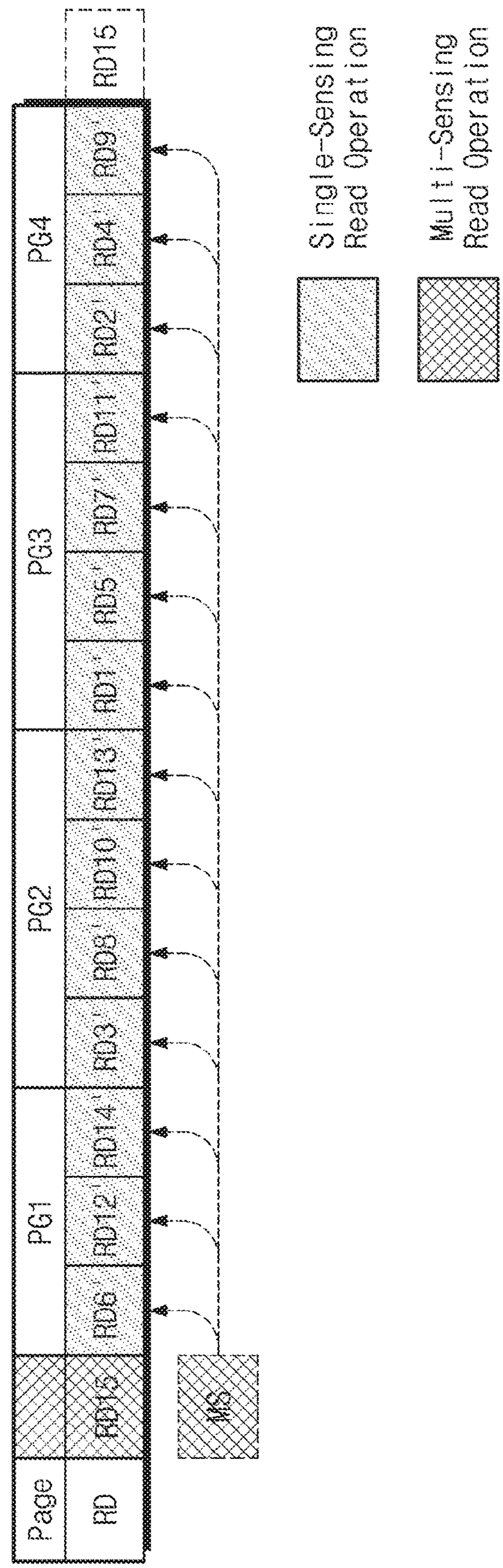
FIG. 27 is a view for explaining an operation method of FIG. 26.

FIG. 27 is a view for explaining an operation method of FIG. 26. For brevity of description, constituent elements not necessary for explaining an operation method of FIG. 26 are omitted.

Referring to FIGS. 21 and 27, the nonvolatile memory device 1200 may perform a read operation with respect to the first through fourth pages PG1 to PG4 in response to the read command CMD_r. In this case, the nonvolatile memory device 1200 may perform a multi-sensing read operation based on the fifteenth read voltage RD15 before performing the read operation with respect to the first through fourth pages PG1 to PG4. The multi-sensing read operation of the fifteenth read voltage RD15 is similar to the operation described with reference to FIG. 24B and thus, a detailed description thereof is omitted.

The nonvolatile memory device 1200 may adjust the first through fourteenth read voltages RD1 to RD14 based on a result of the multi-sensing read operation with respect to the fifteenth read voltage RD15. For example, an improved or optimum level with respect to the fifteenth read voltage RD15 may be selected based on the multi-sensing read operation and the nonvolatile memory device 1200 may adjust the first through fourteenth read voltages RD1 to RD14 based on the selected improved level. An improved or optimum level with respect to the fifteenth read voltage RD15 may be selected based on the multi-sensing read operation and the nonvolatile memory device 1200 may adjust the first through fourteenth read voltages RD1 to RD14 based on a cell count value with respect to the selected improved level. A plurality of counting values may be generated and the nonvolatile memory device 1200 may adjust the first through fourteenth read voltages RD1 to RD14 based on the plurality of counting values. The method of adjusting other read voltages based on the result of the multi-sensing read operation is illustrative and the scope of inventive concepts is not limited thereto.

The nonvolatile memory device 1200 may perform a single-sensing read operation with respect to the first through fourth pages PG1 to PG4 based on adjusted read voltages RD1' to RD14'.

Since the multi-sensing read operation with respect to the fifteenth read voltage RD15 was performed before an overall read operation, the read operation with respect to the fifteenth read voltage RD15 in the read operation with respect to the fourth page PG4 may be omitted.

Figure 28:
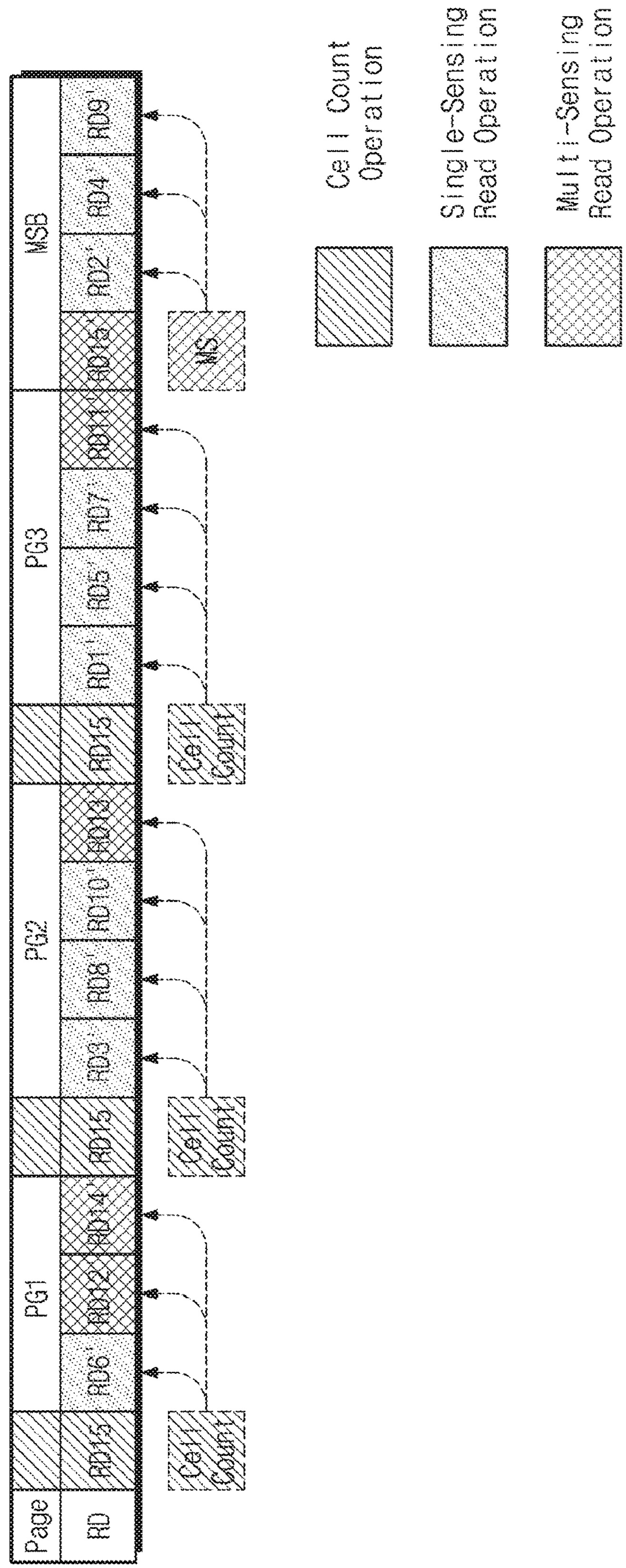
FIG. 28 is a view for explaining an operation of a nonvolatile memory device of FIG. 21.

FIG. 28 is a view for explaining an operation of a nonvolatile memory device of FIG. 21. For brevity of drawings and convenience of description, overlapped constituent elements and a description thereof are omitted.

Referring to FIGS. 21 and 28, the nonvolatile memory device 1200 may perform a read operation with respect to the first through fourth pages PG1 to PG4 in response to the read command CMD_r. In this case, the nonvolatile memory device 1200 may perform a cell count operation based on the fifteenth read voltage RD15 and adjust some corresponding read voltages according to a cell count result before performing a read operation with respect to each of the first through third pages PG1 to PG3. In the read operation with respect to each of the first through third pages PG1 to PG3, the nonvolatile memory device 1200 may perform a single-sensing read operation based on the adjusted read voltage and perform a multi-sensing read operation with respect to some read voltages. The read operation with respect to the first through third pages PG1 to PG3 is similar to the read method of FIG. 25 and thus, a detailed description thereof is omitted.

In a read operation with respect to the fourth page PG, the nonvolatile memory device 1200 may perform a multi-sensing read operation with respect to the fifteenth read voltage RD15 and adjust the remaining read voltages RD2, RD4 and RD9 based on a result of the multi-sensing read operation. That is, in a specific page, the nonvolatile memory device 1200 may perform a multi-sensing read operation with respect to a specific read voltage and adjust levels of other read voltages based on a result of the multi-sensing read operation. In this case, in the read operation with respect to the specific page, the read voltage may be adjusted without an additional cell count operation.

The embodiments of inventive concepts described above are examples for describing a technical spirit of inventive concepts easily and the technical spirit of inventive concepts is not limited thereto. For example, the nonvolatile memory device according to inventive concepts may perform a read operation according to a combination of the various embodiments described above.

Figure 29:
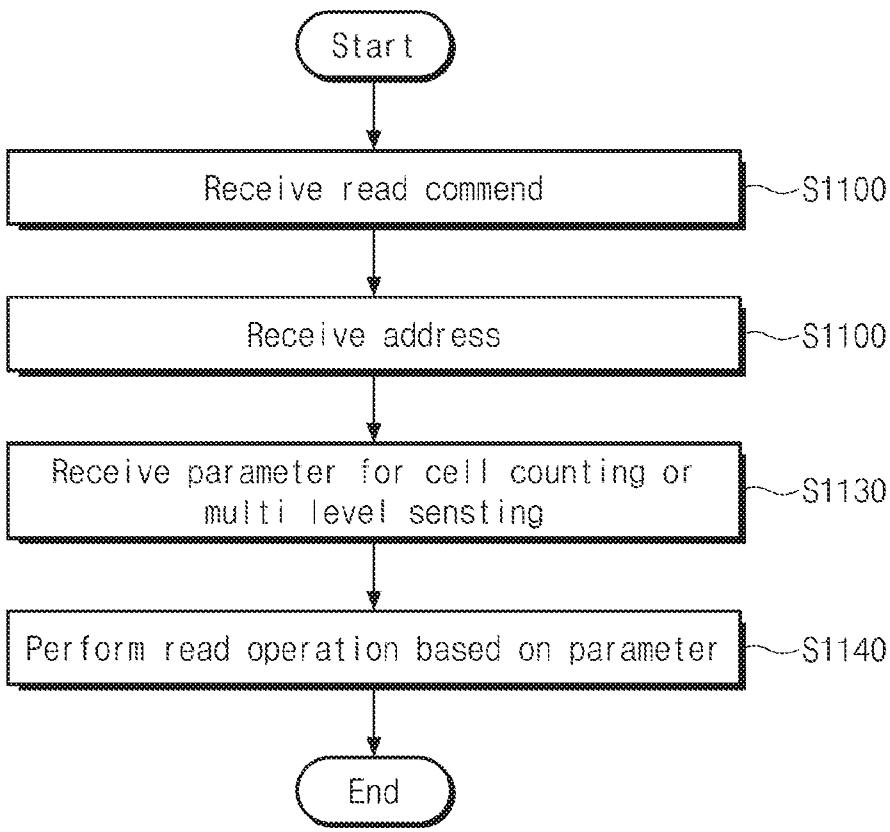
FIG. 29 is a flow chart describing an operation of a nonvolatile memory device according to inventive concepts.

FIG. 29 is a flow chart describing an operation of a nonvolatile memory device according to inventive concepts. Referring to FIGS. 1 and 29, in operation S1110, the nonvolatile memory device 120 may receive the read command CMD_r from the memory controller 110. In operation S1120, the nonvolatile memory device 120 may receive the address ADDR from the memory controller 110.

In operation S1130, the nonvolatile memory device 120 may receive parameters for a cell count or a multi-sensing read operation from the memory controller 110. For example, the parameters may include information included in the RVL LUT 111 or a reference counting value for performing a cell count described with reference to FIG. 8, an offset value of each read voltage according to the reference counting value, or information about a read voltage set for performing the multi-sensing read operation. The parameters may be provided to the nonvolatile memory device 120 through the same signal line as that used when the command CMD and the address ADDR are provided to the nonvolatile memory device 120.

In operation s1140, the nonvolatile memory device 120 may perform a read operation based on the parameters. For example, the nonvolatile memory device 120 may perform the read operation according to the embodiments described above based on the parameters. In further detail, the nonvolatile memory device 120 may perform a cell count based on the received parameters and may adjust read voltages based on a result of the cell count to perform a single-sensing read operation or a multi-sensing read operation. The nonvolatile memory device 120 may also perform a multi-sensing read operation based on the received parameters and may adjust read voltages based on a result of the multi-sensing read operation to perform a single-sensing read operation.

Figure 30:
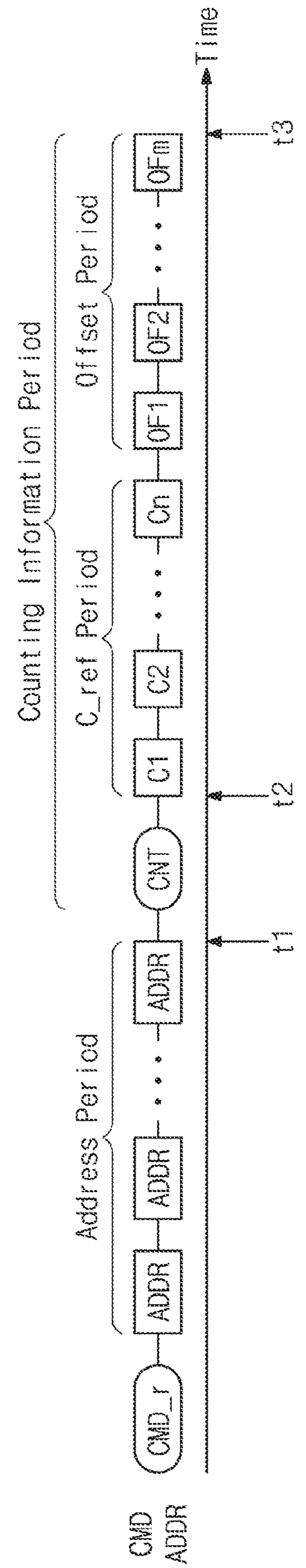
FIG. 30 is a timing diagram illustrating a signal received by a nonvolatile memory device according to an operation method of FIG. 29.

FIG. 30 is a timing diagram illustrating a signal received by a nonvolatile memory device according to an operation method of FIG. 29. Referring to FIGS. 1 and 30, the nonvolatile memory device 120 may receive the read command CMD_r from the memory controller 110. After receiving the read command CMD_r, the nonvolatile memory device 120 may receive the addresses ADDR from the memory controller 110 during an address period. The addresses ADDR may include row addresses and column addresses indicating a physical location where data to be read is stored.

After receiving the addresses ADDR, the nonvolatile memory device 120 may receive the cell count command CNT. The cell count command CNT may indicate a command to perform a cell count operation for adjusting read voltages as described above.

After receiving the cell count command CNT, in a reference counting period (C_ref period), the nonvolatile memory device 120 may receive a plurality of reference counting information C1 to Cn. The plurality of reference counting information C1 to Cn may indicate a reference counting value used in the cell count operation. That is, the plurality of reference counting information C1 to Cn may be used as a reference value compared to a result of the cell count operation.

After receiving the plurality of reference counting information C1 to Cn, in an offset period, the nonvolatile memory device 120 may receive plurality of offset information OF1 to OFm. The plurality of offset information OF1 to OFm may indicate an offset value of each read voltage with respect to the plurality of reference counting information C1 to Cn. That is, a cell count value is compared with the plurality of reference counting information C1 to Cn, and one of the plurality of offset information OF1 to OFm is selected based on a comparison result and the selected offset information is reflected in a corresponding read voltage. As a result, the corresponding read voltage may be adjusted.

The nonvolatile memory device 120 may begin a read operation at a first time t1. During the read operation, the nonvolatile memory device 120 may receive the cell count command CNT, the plurality of reference information C1 to Cn, and the plurality of offset information OF1 to OFm, and may perform a cell count operation based on the received information.

The nonvolatile memory device 120 may begin a read operation at a second time t2. The nonvolatile memory device 120 may receive the plurality of reference information C1 to Cn and the plurality of offset information OF1 to OFm while performing the cell count operation in response to the cell count command CNT. The nonvolatile memory device 120 may adjust read voltages based on a result of the cell count operation, the plurality of reference information C1 to Cn, and the plurality of offset information OF1 to OFm and may perform a single-sensing read operation or a multi-sensing read operation based on the adjusted read voltages.

The nonvolatile memory device 120 may begin a read operation at a third time t3. That is, nonvolatile memory device 120 may receive the cell count command CNT, the plurality of reference information C1 to Cn, and the plurality of offset information OF1 to OFm, may perform a cell counting operation in response to the received information, may adjust the read voltages based on a result of the cell count operation and the received information, and may perform a single-sensing read operation or a multi-sensing read operation based on the adjusted read voltages.

As described above, the nonvolatile memory device according to inventive concepts receives information (e.g., information required to perform the cell count operation or the multi-sensing read operation) required or used to adjust read voltages from the memory controller (or a separate external device) and may perform various read operations according to the embodiments of inventive concepts based on the received information.

Figure 31:
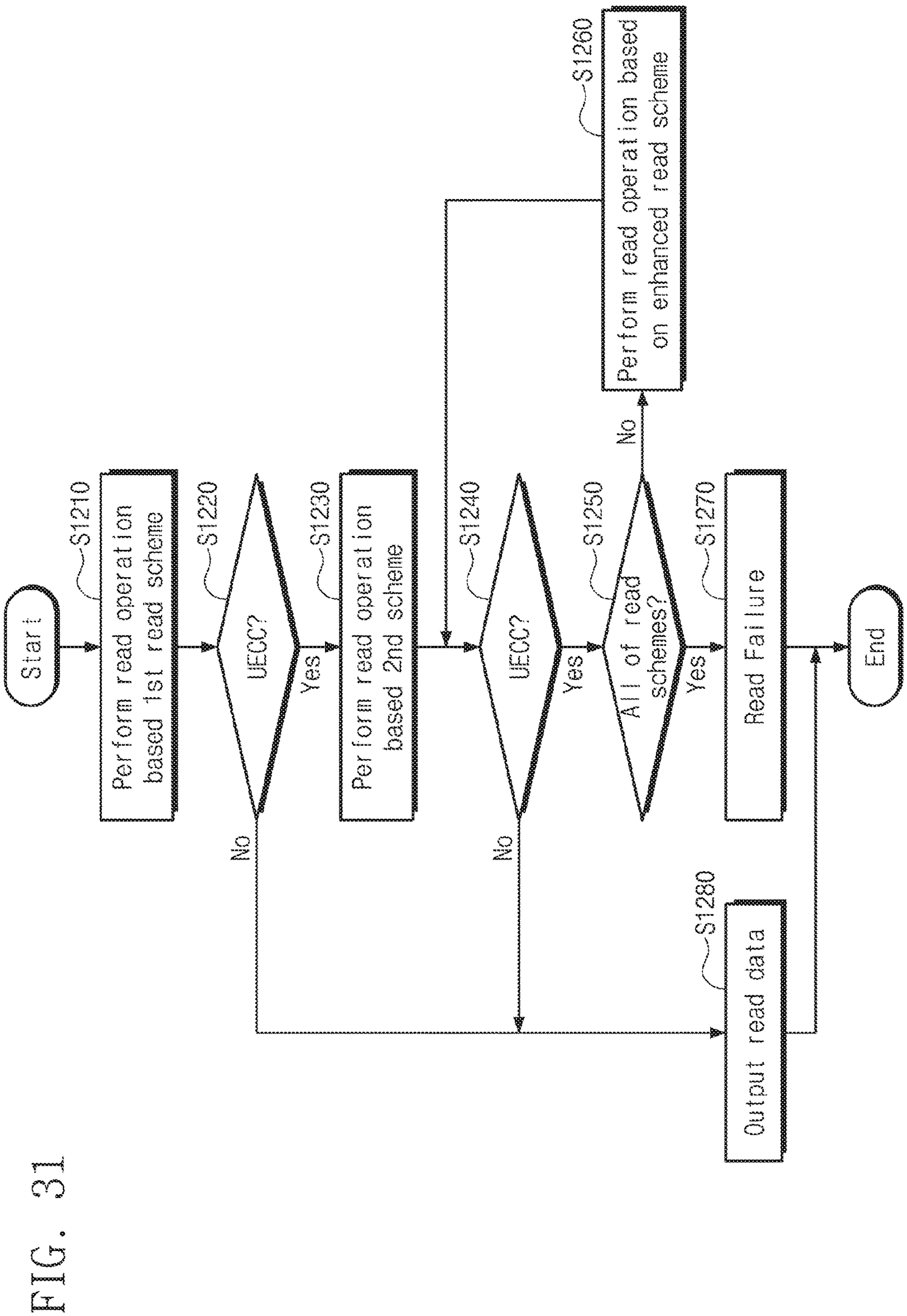
FIG. 31 is a flow chart describing an operation of a memory controller according to inventive concepts.

FIG. 31 is a flow chart describing an operation of a memory controller according to inventive concepts. Referring to FIGS. 1 and 31, the memory controller 110 may perform a read operation based on a first read method. The first read method may be a general read method of performing a read operation based on desired (or, alternatively, predetermined) read voltages. The first read method may be one of read methods according to the embodiments described with reference to FIGS. 1 through 30.

In operation S1220, the memory controller 110 may detect and correct errors read according to the first read method to determine whether an uncorrectable error correction code (UECC) occurs. The "UECC" may indicate a state including an error not corrected by an ECC engine included in the memory controller 110.

When the UECC occurs, in operation S1230, the memory controller 110 may perform a read method based on a second read method. The second read method may be one of the read methods according to the embodiments described with reference to FIGS. 1 through 30. The second read method may be a read method having higher error correction ability than the first read method. For example, when the first read method indicates a general read operation, the second read method may indicate a read operation according to a combination of the multi-sensing read operation and the single-sensing read operation according to the embodiments of inventive concepts. When the first read method is the read operation according to a combination of the multi-sensing read operation and the single-sensing read operation according to the embodiments of inventive concepts, the second read method may indicate a read operation which is a combination of the cell count operation and the single-sensing read operation. For example, the second read method may be one of read operations of various methods having higher error correction ability than the first read method.

In operation S1240, the memory controller 110 may detect and correct an error read according to the second read method to determine whether the UECC occurs.

When the UECC occurs, in operation S1250, the memory controller 110 may determine whether all the read methods are applied. For example, the memory controller 110 may be implemented to support various read methods depending on an implementation method. The memory controller 110 may determine whether executable read methods are all applied.

When executable read methods remain, in operation S1260, the memory controller 110 may perform a read operation based on an improved read method. The improved read method may indicate a read operation having higher error correction ability than the first and second read method described before. The improved read method may include any one of the read methods according to the embodiments described with reference to FIGS. 1 through 30 or read operations according to other read methods (e.g., soft decision, hard decision, valley search, etc.). After that, the memory controller 110 may perform operation S1240.

The memory controller 110 may repeatedly perform operations of the steps S1240 and S1250 until executable read methods are all used.

In the case where executable read methods are all used but errors are not corrected, in operation S1270, the memory controller 110 decides that the read methods fail and may transmit information about a read failure to an external device (e.g., host).

In the case where errors are corrected in the step S1220, S1230 or S1240 and thereby UECC does not occur, the memory controller 110 may transmit the read data (i.e., data of which errors are corrected) to an external device.

As described above, the memory controller according to inventive concepts may use various read operations according to the embodiments described with reference to FIGS. 1 through 31 according to whether an error occurs or not, or an error occurrence step.

Figure 32:
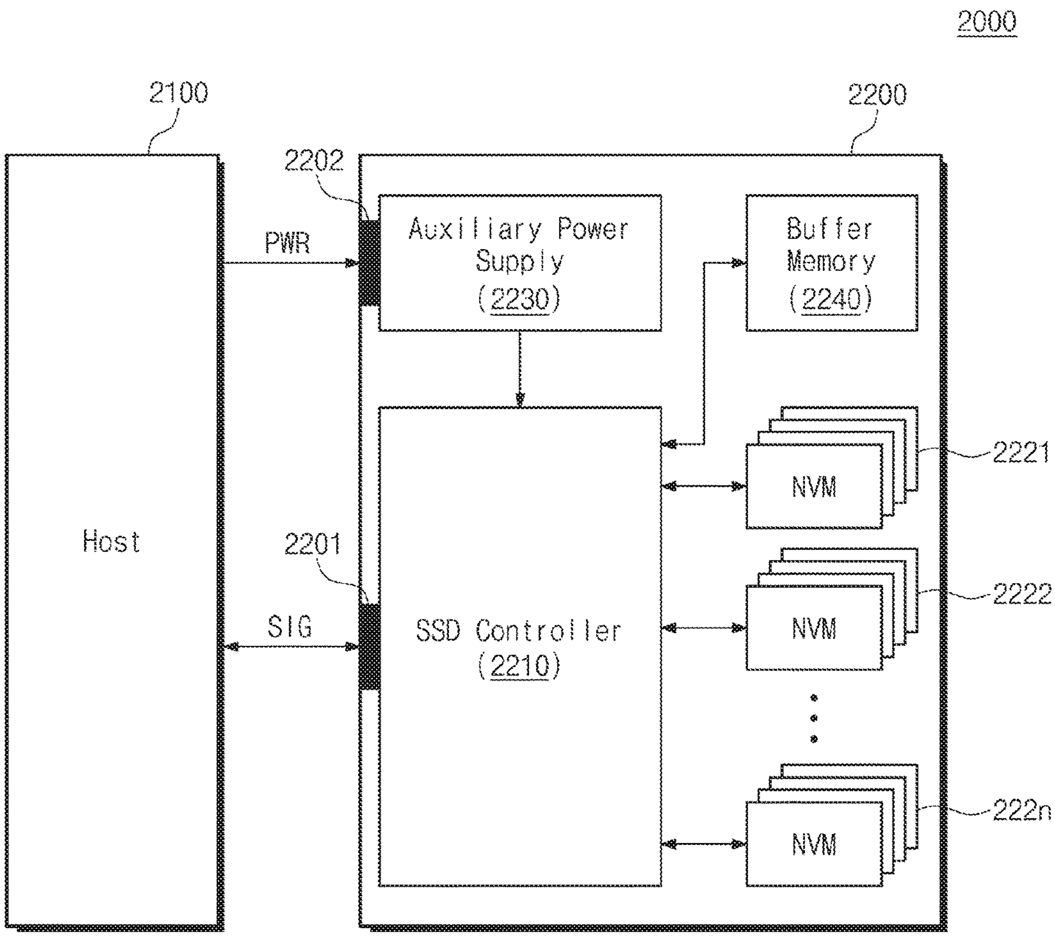
FIG. 32 is a block diagram illustrating a solid state drive (SSD) system including a storage system according to example embodiments of inventive concepts.

FIG. 32 is a block diagram illustrating a solid state drive (SSD) system including a storage system according to example embodiments of inventive concepts. Referring to FIG. 32, the SSD system 2000 includes a host 2100 and a SSD 2200.

The SSD 2200 exchanges a signal with the host 2100 through a signal connector 2201 and receives power PWR through a power connector 2202. The SSD 2200 includes a SSD controller 2210, a plurality of flash memories (2221 to **222*n*), an auxiliary power supply 2230, and a buffer memory 2240**.

The SSD controller 2210 can control the plurality of flash memories (2221 to **222*n*) in response to a signal SIG received from the host 2100. The plurality of flash memories (2221 to 222*n*) may operate under the control of the SSD controller 2210. Each of the plurality of flash memories (2221 to 222*n*) may be implemented by a separate chip or a separate package. Each of the plurality of flash memories (2221 to 222*n*) may operate based on the read operation described with reference to FIGS. 1 through 30**.

The auxiliary power supply 2230 is connected to the host 2100 through the power connector 2202. The auxiliary power supply 2230 may receive power PWR from the host 2100 to be charged. The auxiliary power supply 2230 may provide power of the SSD 2200 when a power supply from the host 2100 is not enough.

The contents described above are specific embodiments for implementing inventive concepts. Inventive concepts may include not only the embodiments described above but also embodiments in which a design is simply or easily capable of being changed. Inventive concepts may also include technologies easily changed to be implemented using embodiments. Thus, the scope of inventive concepts is to be determined by the following claims and their equivalents, and shall not be restricted or limited by the foregoing embodiments.

What is claimed is:

1. A method of operating a nonvolatile memory device including a plurality of memory cells, the method comprising:

receiving a read command from a memory controller;

in response to the read command, performing, based on a reference voltage, a first cell counting operation with respect to the plurality of memory cells;

in response to the read command, adjusting at least one read voltage of first through nth read voltages (where n is a natural number greater than 1) based on a first result of the first cell counting operation; and in response to the read command, performing, based on the adjusted at least one read voltage, a read operation corresponding to the read command with respect to the plurality of memory cells.

2. The method of claim 1, further comprising:

receiving parameters with respect to the first cell counting operation from the memory controller after receiving the read command, wherein the adjusting the at least one read voltage adjusts the at least one read voltage based on the first result and the parameters.

3. The method of claim 2, wherein the parameters comprise a corresponding relationship of a read voltage level change with respect to each of the first through nth read voltages according to the first result.

4. The method of claim 1, wherein each of the plurality of memory cells is configured to have either an erase state or one of first through nth program states, and wherein the first through nth read voltages correspond to the first through nth program states respectively.

5. The method of claim 4, wherein the reference voltage is equal to the nth read voltage or the first read voltage, wherein the nth read voltage corresponds to a most significant program state among the first through nth program states and the first read voltage corresponds to a least significant program state among the first through nth program states.

6. The method of claim 1, wherein the first result indicates a number of memory cells among the plurality of memory cells having a higher threshold voltage than the reference voltage, and wherein when the first result is less than the threshold voltage, a level of the at least one read voltage is reduced by a specific value.

7. The method of claim 1, wherein the performing the read operation corresponding to the read command comprises:

performing a single-sensing read operation using the adjusted at least one read voltage; and performing a multi-sensing read operation with respect to each of unadjusted read voltages among the first through nth read voltages.

8. The method of claim 7, wherein the single-sensing read operation includes determining states of the plurality of memory cells using the adjusted at least one read voltage, and wherein the multi-sensing read operation includes determining states of the plurality of memory cells based on at least two read voltages corresponding to each of the unadjusted read voltages.

9. The method of claim 8, wherein on the basis of the first result, the multi-sensing read operation comprises selecting one of the states of the plurality memory cells based on the at least two read voltages.

10. The method of claim 1, wherein the read operation corresponding to the read command includes reading a first page among a plurality of pages stored in the plurality of memory cells, and wherein the adjusted at least one read voltage is a read voltage corresponding to the first page among the first through nth read voltages.

11. The method of claim 10, further comprising:

performing a second cell counting operation based on the reference voltage;

adjusting at least one second read voltage corresponding to the first through nth read voltages based on a second result of the second cell counting operation; and performing a read operation with respect to a second page among the plurality of pages based on the at least one second read voltage.

12. The method of claim 11, wherein the plurality of memory cells is connected to one word line.

13. A method of operating a nonvolatile memory device including a plurality of memory cells, the method comprising:

receiving a read command from a memory controller;

in response to the read command, performing a multi-sensing read operation based on at least two reference voltages;

in response to the read command, adjusting at least one of first through nth read voltages (n is a natural number greater than 1) based on a first result of the multi-sensing read operation; and in response to the read command, performing, based on the first through nth read voltages, a read operation corresponding to the read command with respect to the plurality of memory cells.

14. The method of claim 13, wherein the performing the multi-sensing read operation comprises:

determining states of the plurality of memory cells based on the at least two reference voltages; and selecting a first voltage among the at least two reference voltages based on the determined states.

15. The method of claim 14, wherein a number of memory cells having a distribution of threshold voltage higher than the first voltage corresponds to the first result.

16. The method of claim 13, wherein each of the plurality of memory cells is configured to be programmed into one of an erase state and first through nth program states before the read operation, and wherein the first through nth read voltages correspond to the first through nth program states respectively.

17. The method of claim 16, wherein the at least two reference voltages include the nth read voltage and the nth voltage corresponds to a most significant program state among the first through nth program states.

18. A storage device comprising:

a nonvolatile memory device including a plurality of memory cells and reading data stored in the plurality of memory cells based on first through nth read voltages (where n is a natural number greater than 1); and a memory controller configured to transmit parameters including information about a read voltage level change of each of the first through nth read voltages after transmitting a read command and an address to the nonvolatile memory device, wherein, in response to the read command, the nonvolatile memory device is configured to:

perform a sensing operation with respect to the plurality of memory cells based on a reference voltage, perform a cell counting operation based on the sensing operation, adjust at least one read voltage of the first through nth read voltages based on a result of the cell counting operation and the parameters, and read data stored in the plurality of memory cells based on the adjusted at least one read voltage.

19. The storage device of claim 18, wherein the parameters includes, a plurality of reference counting information about the reference voltage, and a plurality of offset information about each of the first through nth read voltages according to the plurality of reference counting information.

20. The storage device of claim 19, wherein the nonvolatile memory device is configured to, determine reference counting information corresponding to the result of the cell counting operation among the plurality of reference counting information, determine offset information corresponding to the determined reference counting information among the plurality of offset information, and adjust at least one of the first through nth read voltages based on the offset information.

* * * * *